(12) United States Patent
Sun et al.

(10) Patent No.: US 11,268,984 B2
(45) Date of Patent: Mar. 8, 2022

(54) LOW-COST FIBER OPTIC SENSOR ARRAY FOR SIMULTANEOUS DETECTION OF MULTIPLE PARAMETERS

(71) Applicant: United States Department of Energy, Washington, DC (US)

(72) Inventors: Chenhu Sun, South Park, PA (US); Ping Lu, Sewickley, PA (US); Ruishu Wright, Pittsburgh, PA (US); Paul R Ohodnicki, Allison Prk, PA (US)

(73) Assignee: United States Department of Energy, Washington, DC (US)

( * ) Notice: Subject to any disclaimer, the term of this patent is extended or adjusted under 35 U.S.C. 154(b) by 0 days.

(21) Appl. No.: 16/387,359

(22) Filed: Apr. 17, 2019

(65) Prior Publication Data

US 2019/0317130 A1 Oct. 17, 2019

Related U.S. Application Data

(60) Provisional application No. 62/658,869, filed on Apr. 17, 2018.

(51) Int. Cl.
| | | |
|---|---|---|
| *G01R 1/07* | (2006.01) | |
| *G02B 6/42* | (2006.01) | |
| *G01D 5/353* | (2006.01) | |
| *G01R 31/62* | (2020.01) | |

(52) U.S. Cl.
CPC ........... *G01R 1/07* (2013.01); *G01D 5/35338* (2013.01); *G01R 31/62* (2020.01); *G02B 6/4206* (2013.01); *G02B 6/4298* (2013.01)

(58) Field of Classification Search
None
See application file for complete search history.

(56) References Cited

U.S. PATENT DOCUMENTS

| | | | |
|---|---|---|---|
| 6,205,276 B1* | 3/2001 | Anelli ................. | G02B 6/4494 385/100 |
| 8,411,275 B1* | 4/2013 | Ohodnicki, Jr. ..... | G01N 21/554 356/445 |
| 9,568,377 B1* | 2/2017 | Ohodnicki, Jr. ....... | G01K 11/12 |
| 2008/0272311 A1* | 11/2008 | Egalon ............... | G01N 21/6428 250/458.1 |
| 2009/0034901 A1* | 2/2009 | Takabayashi ......... | G01F 23/292 385/12 |
| 2009/0129721 A1* | 5/2009 | Chen .................... | G01F 23/292 385/12 |
| 2011/0069316 A1* | 3/2011 | Chau .................. | G02B 6/02052 356/445 |

* cited by examiner

*Primary Examiner* — Jas A Sanghera
(74) *Attorney, Agent, or Firm* — Timothy L. Harney; Aaron R. Keith; Michael J. Dobbs

(57) ABSTRACT

A system and method for forming a low cost optical sensor array. The sensor includes an optical fiber; a first nanocomposite thin film along at least a portion of the optical fiber for interrogating a first parameter through a correlated signal having a first wavelength; and a second nanocomposite thin film along at least a portion of the optical fiber for interrogating a second parameter through a correlated signal having a second wavelength different from the wavelength of the first parameter.

13 Claims, 49 Drawing Sheets

LOW-COST FIBER OPTIC SENSOR ARRAY FOR SIMULTANEOUS DETECTION OF MULTIPLE PARAMETERS

This application claims the benefit of U.S. Provisional Application No. 62/658,869 filed on Apr. 17, 2018, the disclosure of which is incorporated herein by reference

GOVERNMENT INTEREST

The United States Government has rights in this invention pursuant to the employer-employee relationship of the Government to the inventors as U.S. Department of Energy employees and site-support contractors at the National Energy Technology Laboratory.

FIELD OF THE INVENTION

The disclosure provides a system and method for sensing multiple parameters. More specifically, one or more embodiments relate to a low cost optical fiber sensor array that monitors multiple parameters using multi-wavelength interrogation combined with multiple sensor elements along a single optical fiber. A primary example of interest to us, is for low cost temperature and dissolved gas analysis applications for electrical asset monitoring (such as transformers). In this application it is desired to monitor local temperature of oil as well as the chemical composition of a number of key chemical indicators ($H_2$, $CO$, $CH_4$, $C_2H_2$, $H_2O$, etc.).

BACKGROUND

The disclosure relates to a system and method for sensing multiple parameters. More specifically, one or more embodiments relate to a low cost optical fiber sensor array that monitors multiple parameters using multi-wavelength interrogation combined with multiple sensor elements along a single optical fiber.

Power transformers are among the most essential components of electrical transmission and distribution networks. In order to avoid the substantial financial and social expenses caused by catastrophic failures, there is a growing need to developing low-cost and real-time analytical techniques and instruments to detect and diagnose fundamental changes in the operating characteristics of transformers. Certain key parameters, such as dissolved gases content and oil temperature, provide valuable information for assessing the condition of transformers as this usually the first available indication of the transformer health. The dissolved gas analysis (DGA) identifies the electrical or thermal faults based on the composition, concentration and evolution trend of the gases in oil.

Hydrogen ($H_2$) is generated in most faults and thus is the most informative key gas in DGA. Based on the fault types, a wide dynamic range from 100 ppm to 1800 ppm or higher could be monitored to determine the risk conditions. The normal operating temperatures of the top oil in power transformers are from ambient temperature to 110° C. If the temperature exceeds 90° C., the aging rate of paper insulation and tensile strength grows rapidly, resulting in a dramatic deterioration of transformer life expectancy. The heat generated by energy loss in the corresponding parts of the transformer is transferred to the insulation oil by convection and then to the cooling medium. When the top oil temperature rises above the ambient temperature, the transformer loading elevates which increases the loss and further increase the overall temperature. Under certain conditions, the temperature rise can become runaway ultimately leading to a catastrophic failure of the transformer. It is therefore of significant value to monitor the temperature under various ambient and loading conditions to identify incipient failures before they result in significant damages, economic and otherwise.

A variety of sensor-based technologies that are currently under development exhibit great potential for continuous monitoring of dissolved gases and temperature in real-time without disrupting the transformer operation. Particularly, sensors using the fiber optic platform has become very intriguing because of its low cost, multiplexing capability and ideal compatibility with the electrified environments. A wide range of sensing materials have been developed, among which noble metal nanoparticles embedded nanocomposites are emerging as novel functional materials for enhanced optical response.

For example, palladium (Pd) based thin films have been applied to optical hydrogen sensors. In the presence of $H_2$, both the real and imaginary part of the Pd-complex refractive index changes and produces optical signals. Pd and AuPd alloy nanoparticles embedded silica films have been deposited on optical fibers for the detection of $H_2$ as an evanescent wave absorption spectroscopy sensor and tested under a range of temperatures and gas environments. More recently, a double-layer structure consisted of a Pd—$SiO_2$ sensing layer and a zeolite nano-blocks filter layer has been constructed on optical fiber for sensitive and selective measurement of $H_2$ at room temperature. Gold (Au) nanoparticles based sensing material showing a localized surface plasmon resonance (LSPR) absorption peak has also been explored in various sensing applications. For example, the LSPR absorption peak of Au—$TiO_2$ film has been monitored as a function of temperature up to 850° C. The shift of the LSPR peak and change in the absorbance peak height and full-width at half maximum has also been demonstrated by simultaneous gas and temperature sensing of Au—$SiO_2$ plasmonic nanocomposite deposited on optical fibers.

It has been recognized that the multiplexing capability of fiber optic sensors enable the monitoring of multiple sensing points with a single interrogation unit. For example, fiber optic sensors have been developed for spatially resolved monitoring of temperatures as well as other parameters through distributed interrogation methodologies. The real-time monitoring of energized transformer core temperature has been demonstrated using a distributed fiber optic sensor and a distributed interrogation system was incorporated into a single-mode fiber optic sensor for measuring the spatial distribution of temperature in the presence of hydrogen in solid-oxide fuel cells, which also has the potential for dual $H_2$/temperature sensor development moving into the future.

Optical sensor arrays can also be fabricated by connecting a series of sensors using optical fibers. When several of these sensors are cascaded one after the other, an overlap of the peaks or dips may occur. However, the unique wavelength dependences of optical sensors can potentially enable the deconvolution of these effects to allow simultaneous monitoring of multiple signals with the sensor array. Due to the costs of many advanced optical components utilized for the interrogation of optical fibers in conventional sensing applications, a key technical challenge remaining with the optical fiber platform lies in the ability to creatively develop multi-functional and low-cost sensors that are economically viable yet retain critical advantages of the technology platform.

More specifically, there is an urgent need for sensors that detect temperature and hydrogen as well as other reducing gas species (e.g. CO) and hydrocarbons (e.g. CH4, C2H2). Moreover, there is a need for sensors used in electrical transmission, distribution networks and other electrical grid asset health monitoring such as low cost dissolved gas analysis systems that are capable of monitoring critical parameters in distribution transformers for example.

The following issued documents and publications are incorporated herein by reference in their entity:

Sun, C., Ohodnicki, P. R., and Stewart, E. M., "Chemical sensing strategies for real-time monitoring of transformer oil: A review," IEEE Sensors Journal, 17(18), 5786-5806 (2017)

Wang, M., Vandermaar, A., and Srivastava, K. D., "Review of condition assessment of power transformers in service," IEEE Electrical Insulation Magazine, 18(6), 12-25 (2002).

"IEEE Guide for the Interpretation of Gases Generated in Oil-Immersed Transformers," IEEE Std C57.104-2008 (Revision of IEEE Std C57.104-1991), 1-36 (2009).

"IEEE Guide for Loading Mineral-Oil-Immersed Transformers," IEEE Std C57.91-1995, (1996).

Mamizadeh, A., and İ, İ., "Evaluation of permissible loading for indoor oil-immersed distribution transformers." 2009 International Conference on Electrical and Electronics Engineering—ELECO 2009, Bursa, I-216-I-220 (2009).

Susa, D., Lehtonen, M., and Nordman, H., "Dynamic thermal modelling of power transformers," IEEE transactions on Power Delivery, 20(1), 197-204 (2005).

Chatterjee, A., Bhattacharjee, P., Roy, N., and Kumbhakar, P., "Usage of nanotechnology based gas sensor for health assessment and maintenance of transformers by DGA method," International Journal of Electrical Power & Energy Systems, 45(1), 137-141 (2013).

Mahanta, D. K., and Laskar, S., "Transformer Condition Monitoring using Fiber Optic Sensors: A Review," ADBU Journal of Engineering Technology, 4, (2016).

Silva, S. F., Coelho, L., Frazão, O., Santos, J. L., and Malcata, F. X., "A review of palladium-based fiber-optic sensors for molecular hydrogen detection," IEEE Sensors Journal, 12(1), 93-102 (2012).

Ohodnicki, P., Baltrus, J., and Brown, T., "Pd/SiO2 and AuPd/SiO2 nanocomposite-based optical fiber sensors for H2 sensing applications," Sensors and Actuators B: Chemical, 214, 159-168 (2015).

Sun, C., Ohodnicki, P. R., and Yu, Y., "Double-Layer Zeolite Nano-Blocks and Palladium-Based Nanocomposite Fiber Optic Sensors for Selective Hydrogen Sensing at Room Temperature," IEEE Sensors Letters, 1(5), 1-4 (2017).

Ohodnicki, P. R., Brown, T. D., Buric, M. P., Baltrus, J. P., and Chorpening, B., "Plasmon resonance at extreme temperatures in sputtered Au nanoparticle incorporated TiO2 films." Proc. SPIE, 8456, 845608 (2012).

Ohodnicki, P. R., Buric, M. P., Brown, T. D., Matranga, C., Wang, C., Baltrus, J., and Andio, M., "Plasmonic nanocomposite thin film enabled fiber optic sensors for simultaneous gas and temperature sensing at extreme temperatures," Nanoscale, 5(19), 9030-9039 (2013).

Grattan, K., and Sun, T., "Fiber optic sensor technology: an overview," Sensors and Actuators A: Physical, 82(1), 40-61 (2000).

Bao, X., and Chen, L., "Recent progress in distributed fiber optic sensors," Sensors, 12(7), 8601-8639 (2012).

Lu, P., Byerly, K., Buric, M., Zandhuis, P., Sun, C., Leary, A., Beddingfield, R., McHenry, M., and Ohodnicki, P. R., "Distributed fiber-optic sensor for real-time monitoring of energized transformer cores." Proc. SPIE, 10194, 101941S-101941S-13 (2017).

Buric, M., Ohodnicki, P., Yan, A., Huang, S., and Chen, K. P., "Distributed fiber-optic sensing in a high-temperature solid-oxide fuel cell." Proc. SPIE, 9977, 997708-1-997708-11 (2016).

Cárdenas-Sevilla, G. A., Finazzi, V., Villatoro, J., and Pruneri, V., "Photonic crystal fiber sensor array based on modes overlapping," Optics express, 19(8), 7596-7602 (2011).

Ando, M., Kobayashi, T., Iijima, S., and Haruta, M., "Optical recognition of CO and H2 by use of gas-sensitive Au—Co3O4 composite films," Journal of Materials Chemistry, 7(9), 1779-1783 (1997).

Yang, R. T. and Foldes, R., 1996. New adsorbents based on principles of chemical complexation: Monolayer-dispersed nickel (II) for acetylene separation by Tr-complexation. Industrial & engineering chemistry research, 35(4), pp.1006-1011.

Xie, Y. C. and Tang, Y. Q., 1990. Spontaneous monolayer dispersion of oxides and salts onto surfaces of supports: applications to heterogeneous catalysis. In Advances in catalysis (Vol. 37, pp. 1-43). Academic Press.

Tsigara, A., Madamopoulos, N., Hands, M., Athanasekos, L., Meristoudi, A., Mousdis, G., Manasis, G., Vainos, N. and Koutselas, I., 2006, October. NiCl2/SiO2 sol-gel material for ammonia sensing. In Advanced Environmental, Chemical, and Biological Sensing Technologies IV (Vol. 6377, p. 63770B). International Society for Optics and Photonics.

Creighton, J. A.; Eadon, D. G. J. Chem. Soc., Faraday Trans. 1991, 87, 3881.

Angew. Chem. Int. Ed. 2005, 44, 7913-7917

Nano Lett., Vol. 5, No. 7, 2005

Wenger, B; Gratzel, M; Moser, J., 2005, Rationale for Kinetic Heterogeneity of Ultrafast Light-Induced Electron Transfer from Ru(II) Complex Sensitizers to Nanocrystalline TiO2J. (SOC. 9 VOL. 127, NO. 48) TiO2 J. AM. CHEM. SOC.

These and other objects, aspects, and advantages of the present disclosure will become better understood with reference to the accompanying description and claims.

SUMMARY

One embodiment relates to a system and method for sensing multiple parameters. More specifically, one or more embodiments relate to a low cost optical fiber sensor array that monitors multiple parameters using multi-wavelength interrogation combined with multiple sensor elements along a single optical fiber. One exemplary embodiment may be used for low cost temperature and dissolved gas analysis applications for electrical asset monitoring (such as transformers). In this application it is desired to monitor local temperature of oil as well as the chemical composition of a number of key chemical indicators such as H2, CO, CH4, C2H2, $H_2O$, and the like.

One embodiment relates to a low cost optical sensor array. The sensor includes an optical fiber; a first nanocomposite thin film along at least a portion of the optical fiber for interrogating a first parameter having a first wavelength; and a second nanocomposite thin film along at least a portion of the optical fiber for interrogating a second parameter having a second wavelength different from the wavelength of the first parameter.

Still another embodiment relates to a low cost optical system for monitoring multiple parameters of an electrical asset. The optical system includes a low cost optical system, a sensor array in optical communication with the optical system; and an analysis portion in optical communication with the sensor array. The sensor array includes an optical fiber; a first nanocomposite thin film along at least a portion of the optical fiber for interrogating a first parameter having a first wavelength; and a second nanocomposite thin film along at least a portion of the optical fiber for interrogating a second parameter having a second wavelength different from the wavelength of the first parameter; and an analysis portion in optical communication with the sensor array.

Still another embodiment relates to a method of monitoring multiple parameters of an electrical asset. The method includes determining a wavelength with a signal correlated with a first parameter of the electrical asset to be monitored; determining a wavelength with a signal correlated with at least a second parameter of the electrical asset to be monitored; and sensing the first and second parameters using an optical fiber, the optical fiber having a first nanocomposite thin film along at least a portion of the optical fiber for interrogating the first parameter correlated with a signal at the first wavelength and a second nanocomposite thin film along at least a portion of the optical fiber for interrogating the second parameter correlated with a signal at the second wavelength.

One or more embodiments may include the sensor array further including one or more nanocomposite thin films along at least a portion of the optical fiber for interrogating one or more parameters, each parameter uniquely correlated with signals at a different wavelength. Additionally, embodiments may include one or more multimode fibers in optical communication with the optical fiber.

Additional embodiments may include the first nanocomposite thin film selected from the group comprising $Au/SiO_2$, $Pd/SiO_2$ and Ni doped porous $SiO_2$ thin film, and the like. Yet other embodiments may include the second nanocomposite thin film selected from the group comprising $Au/SiO_2$, $Pd/SiO_2$ and Ni doped porous $SiO_2$ thin film, and the like.

Embodiments include at least one of the first and second parameters is temperature and/or a chemical composition of a key chemical indicator. The key chemical indicator is selected from the group comprising $H_2$, $CO$, $CH_4$, $C_2H_2$, and $H_2O$. Further embodiments may include a filter layer of zeolite nanoblock coating at least one of the first nanocomposite thin film and the second nanocomposite thin film.

Yet other embodiments include the optics system comprising one or more light emitting diodes, and one or more filters. The one or more filters comprises one or more lenses designed to maximize light coupling and increase signal. An analysis potion may include one or more photodiodes, a multimeter and a computer in communication with the multimeter, the computer performing multi-variate data analytics such as principle component analysis, for example, to extract independent information from the sensor array for optimized wavelength selection of discrete wavelengths. Additionally, embodiments may include a plurality of sensor arrays connected in series.

One or more embodiments relate to a sensor for temperature and hydrogen detection. The sensor includes a coreless optical fiber having a first terminal end and a lateral surface; and a first multimode fiber in optical communication with the first terminal end. The sensor further includes a first nanocomposite thin film on at least a portion of the lateral surface.

Another embodiment relates to a sensor for temperature and hydrogen detection. The sensor includes a coreless optical fiber having a first terminal end, a second terminal end, and a lateral surface. A first multimode fiber is in optical communication with the first terminal end and a second multimode fiber in optical communication with the second terminal end. The sensor further includes an $Au/SiO_2$ thin film on at least a portion of the lateral surface and, a $Pd/SiO_2$ thin film on at least a portion of the lateral surface.

Various embodiments of the system and methodology disclosed are further demonstrated and described in the following description.

DETAILED DESCRIPTION

The following description is provided to enable any person skilled in the artto use the invention and sets forth the best mode contemplated by the inventor for carrying out the invention. Various modifications, however, will remain readily apparent to those skilled in the art, since the principles of the present invention are defined herein specifically to provide a system and methodology for a low-cost, field deployable, dual purpose sensing device for on-site deployment in power transformers, distribution transformers, and other electrical grid asset health monitoring.

Monitoring the dissolved gases and oil temperatures is well established to be a dependable strategy for assessing the running state and health of power transformers. Novel fiber optic sensor approaches that minimize the footprint and cost of chemical sensors compatible with electrical asset insulation oil monitoring can ultimately allow the deployment on a broader range of power assets. Fiber optic sensor arrays based on nanocomposite thin films for simultaneous multi-parameters such as gas and temperature sensing at low temperatures have been fabricated. The potential applications of such sensor arrays are dual-purpose gas and temperature sensing for on-site deployment in power transformers and other grid asset health monitoring.

Figure 1:
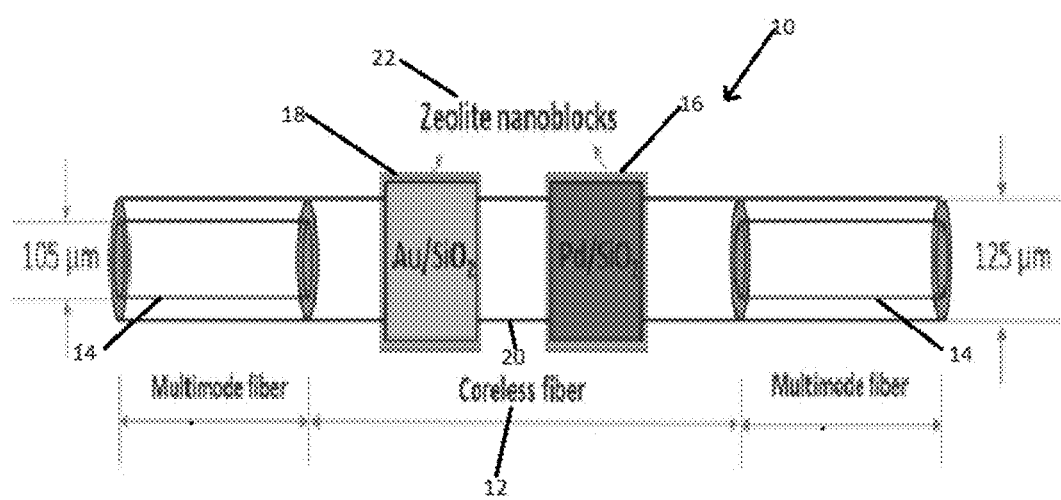
FIG. 1 depicts a schematic diagram of a sensor structure in accordance with one embodiment.

FIG. 1 illustrates an exemplary embodiment of the present invention relating to an optical sensor generally designated 10 including coreless fiber 12 and one or more multimode fiber 14. The coreless fiber 12 utilizes Pd/SiO2 and Au/SiO2 nanocomposites thin films 16 and 18 respectively, coupled together as two sensing elements which are cascaded one after the other on a lateral surface of a single optical fiber 20 for use in simultaneous detection of hydrogen (H2) and temperature for example.

In the illustrated embodiment, at least two multimode fibers 14 are joined, fusion spliced for example, to opposing ends of the coreless fiber 12, making the sensor 10 easier to carry in addition to eliminating a need for chemical etching of an optical fiber prior to sensing layer deposition. Embodiments of the sensor 10 detect responses of temperature between ambient room temperature to approximately 110° C. and $H_2$ between 100 to 2000 ppm. In at least one embodiment, a filter layer of zeolite nanoblocks 22 was then coated on one or both of the sensing films 16/18 to remove CO interference. Embodiments of the sensor 10 include low-cost, dual-purpose sensing for on-site deployment in power transformers and other electrical grid asset health monitoring.

One embodiment of the sensor 10 includes coreless fiber 12 (FG125LA, Thorlabs) consisting of a pure silica glass rod (Ø125 µm) and an acrylate coating (Ø250 µm). The multimode fibers 14 (FG105UCA, Thorlabs) consists of a silica core (Ø105 µm) with fluorine-doped glass cladding (Ø125 µm). The coreless fiber 12 with the coating stripped was fusion spliced between the two multimode fibers 14. A section of 30 cm silica coreless fiber 12 was sandwiched between two standard multimode fibers 14 with a fusion splicer. The whole coreless fiber 12 was stripped to induce a no-coating region for the subsequent sensing layer coating process.

Adoption of standard fusion splicing method guarantees low-loss and high-throughput of fabrication of multiple sensors along a single optical fiber, making this fiber optic sensor array become more practical in a remote and multi-parameter measurement fashion. Pd and Au nanoparticles incorporated SiO2 nanocomposites were synthesized by the sol-gel method, respectively. The two composite solutions were then dip-coated in series of 5 cm onto the coreless fiber. The separation between the two consecutive films was around 5 cm. The coated fiber was calcined in air at 600° C. for 1 h and then in H2 at 500° C. for 1 h. An additional filter layer of zeolite nanoblocks was then coated on the sensing films to remove CO interference.

Figure 2:
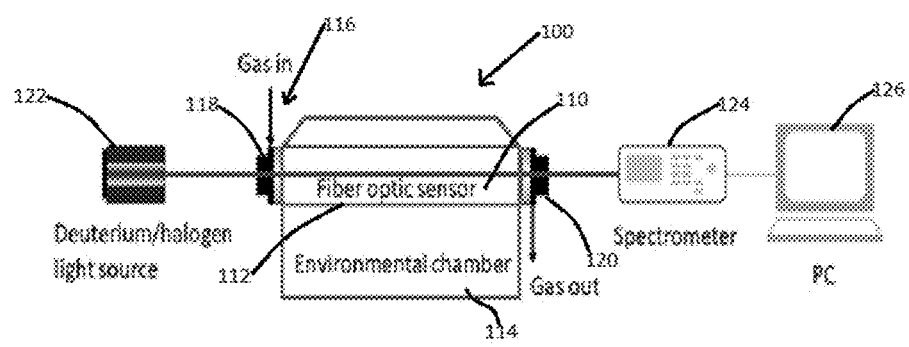
FIG. 2 depicts a schematic diagram of a known conventional optical system.

FIG. 2 depicts a schematic diagram of a known conventional optical system generally designated 100. In this embodiment, the optical fiber sensor 110 was placed in a quartz tube 112 within an environmental chamber 114. FIG. 2 depicts the automated gas delivery system 116 having input 118 and output 120 delivers the test gas into the tube 112 using a calibrated mass flow controller (not shown). In at least one embodiment, the total gas flow rate was maintained at 100 sccm by mixing different concentrations of H2 in a balance of N2. In order to minimize the oxidation state changes of Pd-based nanoparticles, all sensors were pretreated in pure H2 at 500° C. for 1 h before cooling down to room temperature at which subsequent sensing tests were performed to ensure a reproducible starting baseline. All gas sensing experiments were performed on a conventional setup and a low-cost prototype device in the background of N2. The conventional setup 110 was built by connecting the fiber 110 with a DH-2000-BAL balanced deuterium/halogen light source 122 and a JAZ spectrometer 124 (Ocean Optics, Inc.) connected to a PC 126.

Figure 3:
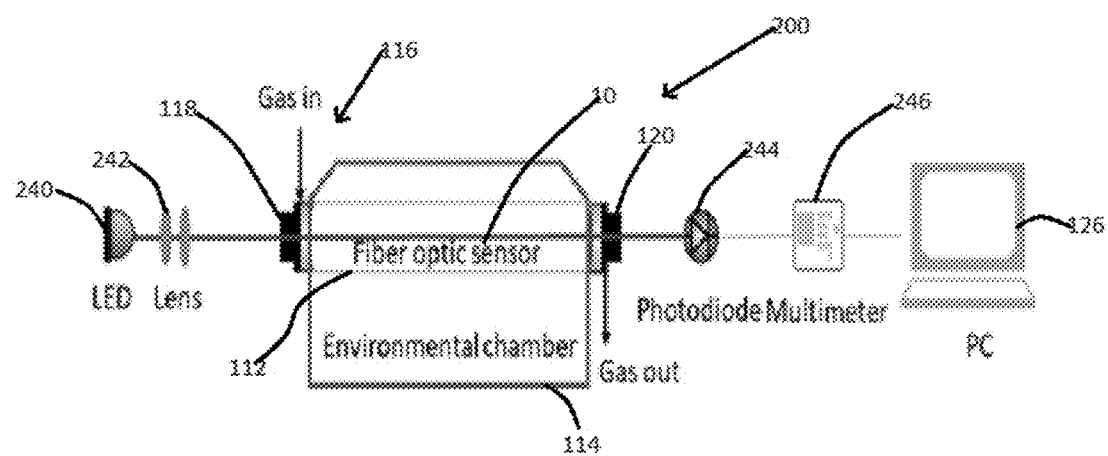
FIG. 3 depicts a schematic diagram of a low cost optical system using the sensor of FIG. 1.

FIG. 3 depicts a schematic diagram of the low cost optical system, generally designated 200 using sensor 10 of FIG. 1. In this embodiment, the optical fiber sensor 10 was placed in quartz tube 112 within the environmental chamber 114. FIG. 3 depicts the automated gas delivery system 116 having input 118 and output 120 delivering the test gas into the tube 112 using a calibrated mass flow controllers (not shown). The total gas flow rate was maintained at 100 sccm by mixing different concentrations of H2 in a balance of N2. As illustrated, the setup 200 was built by connecting the fiber 110 with an LED 240 and lens 242 and a photodiode 244, multimeter 246 connected to a PC 126.

Figure 4:
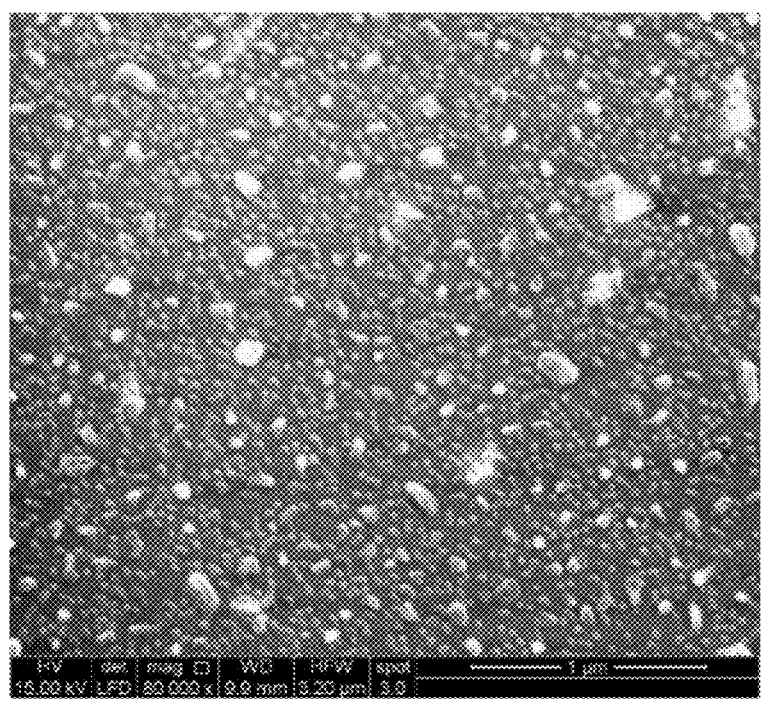
FIG. 4 depicts a SEM image for the surface morphology of $Pd/SiO_2$ film.
Figure 5:
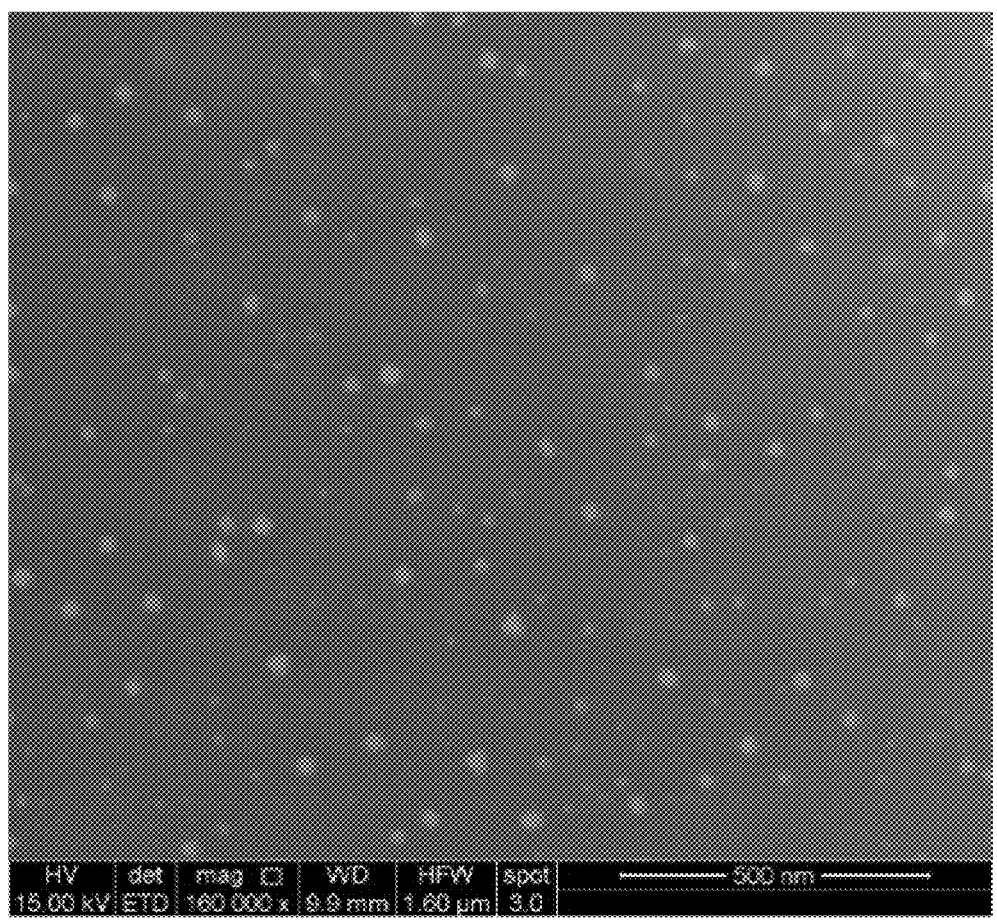
FIG. 5 depicts a SEM image for the surface morphology of $Au/SiO_2$ film.
Figure 6:
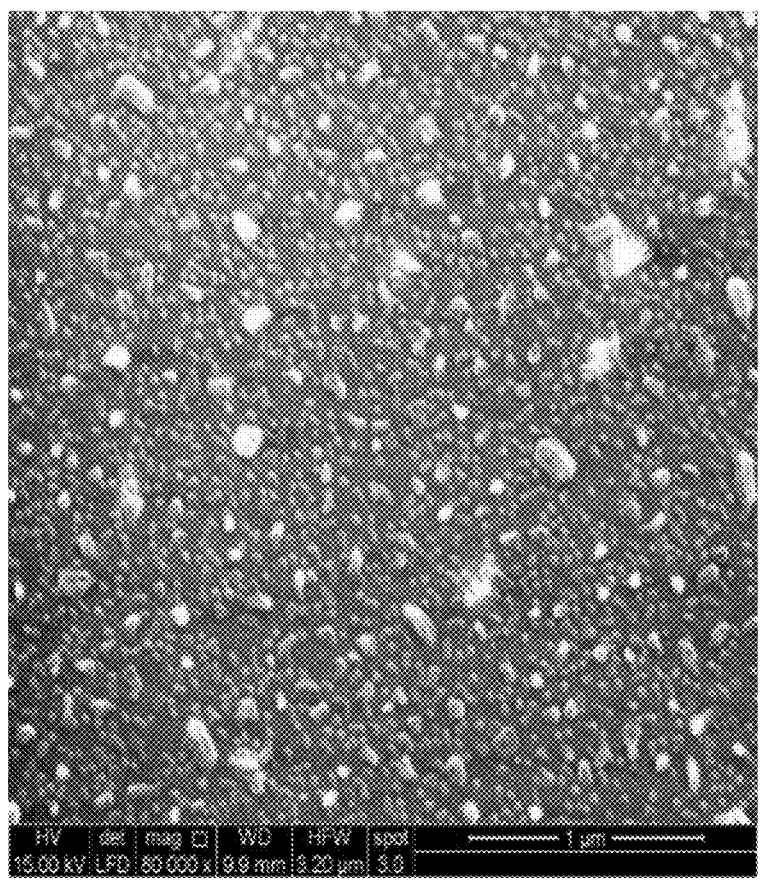
FIG. 6 depicts a SEM image for the surface morphology of Zeolite nano-blocks filter.

FIG. 4 depicts a SEM image for the surface morphology of Pd/SiO2 film, FIG. 5 depicts a SEM image for the surface morphology of Au/SiO2 film, while FIG. 6 depicts a SEM image for the surface morphology of Zeolite nano-blocks filter. The SEM images of the sensing layer coated on the fiber surface clearly showed a microstructure consisting of 5-30 nm diameter noble metal nanoparticles embedded within the SiO2 matrix after 600° C. calcination (See FIG. 4-5). The typical film thickness is estimated to be ~100 nm. After coating the filter layer on top of the sensing layer, clustered zeolite nano-blocks were observed, See FIG. 6.

Figure 7:
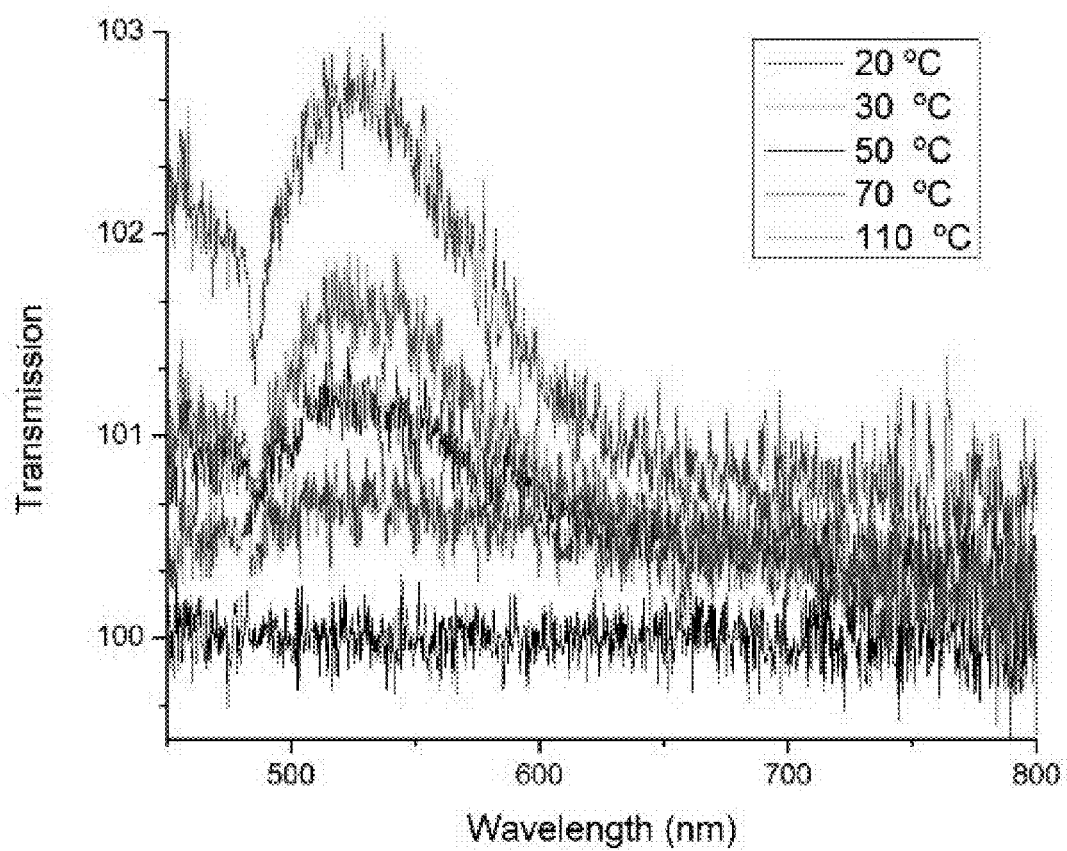
FIG. 7 depicts temperature sensing responses of a transmission spectra as a function of time.
Figure 8:
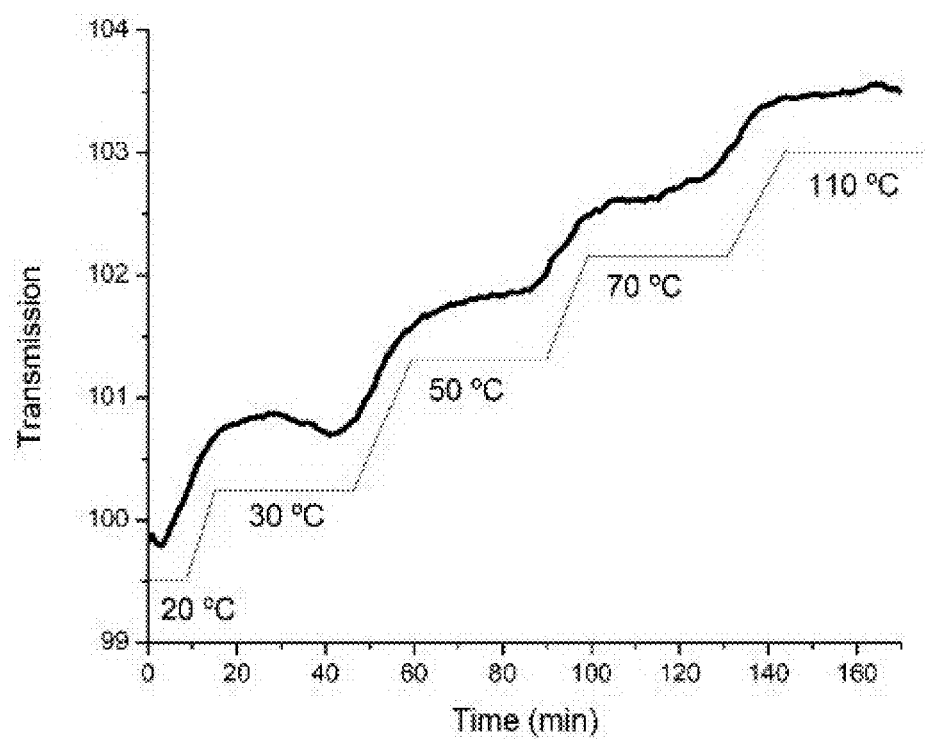
FIG. 8 depicts the temperature sensing response of a transmission at 525 nm as a function of time.

FIG. 7 depicts temperature sensing responses of a Transmission spectra as a function of time while FIG. 8 depicts the temperature sensing response of a Transmission at 525 nm as a function of time. The optical transmission spectra was recorded at elevated temperatures from ambient to 110° C. in the background of N2 (See FIG. 7). Each step was ramped in 10 min and stayed in 30 min for the desired temperature. A broad band from 500-600 nm with a peak maximum at ~525 nm was observed due to the Au LSPR absorption peak. An increase in the transmission intensity in the vicinity of the LSPR peak maximum with increasing temperature was clearly resolved. The relative transmission measured at 525 nm is plotted as a function of temperature to demonstrate the wavelength dependent temperature response (See FIG. 8). The LSPR peak broadening and reduced absorption peak height was explained by increasing damping frequency associated with an increased resistivity of Au NPs at high temperatures. The temperature dependence of the optical constants in the matrix also determines the shift of the LSPR peak.

Figure 9:
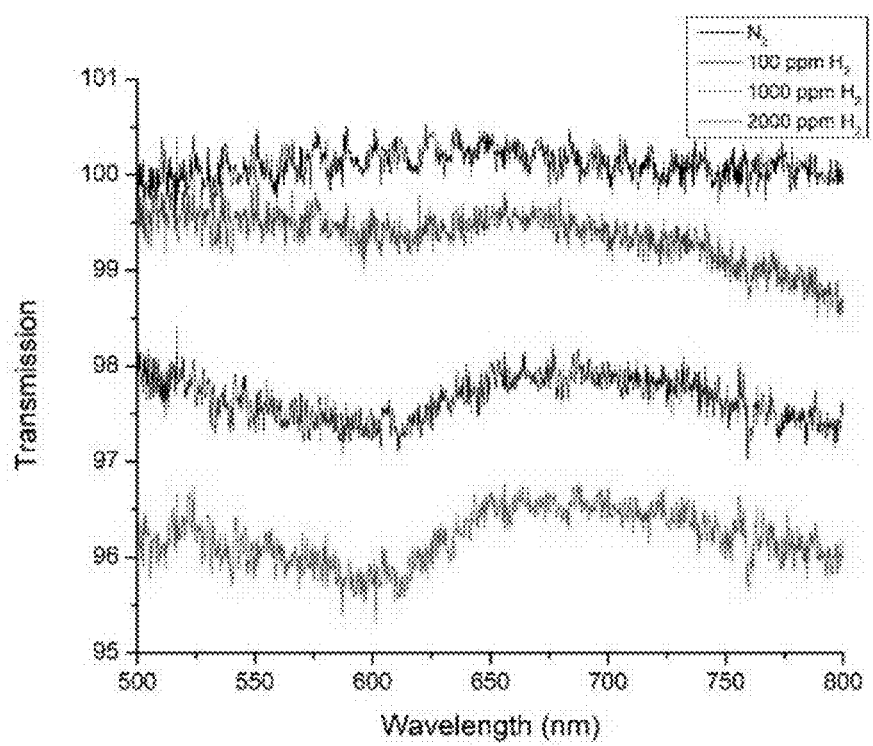
FIG. 9 depicts the $H_2$ sensing response transmission spectra.
Figure 10:
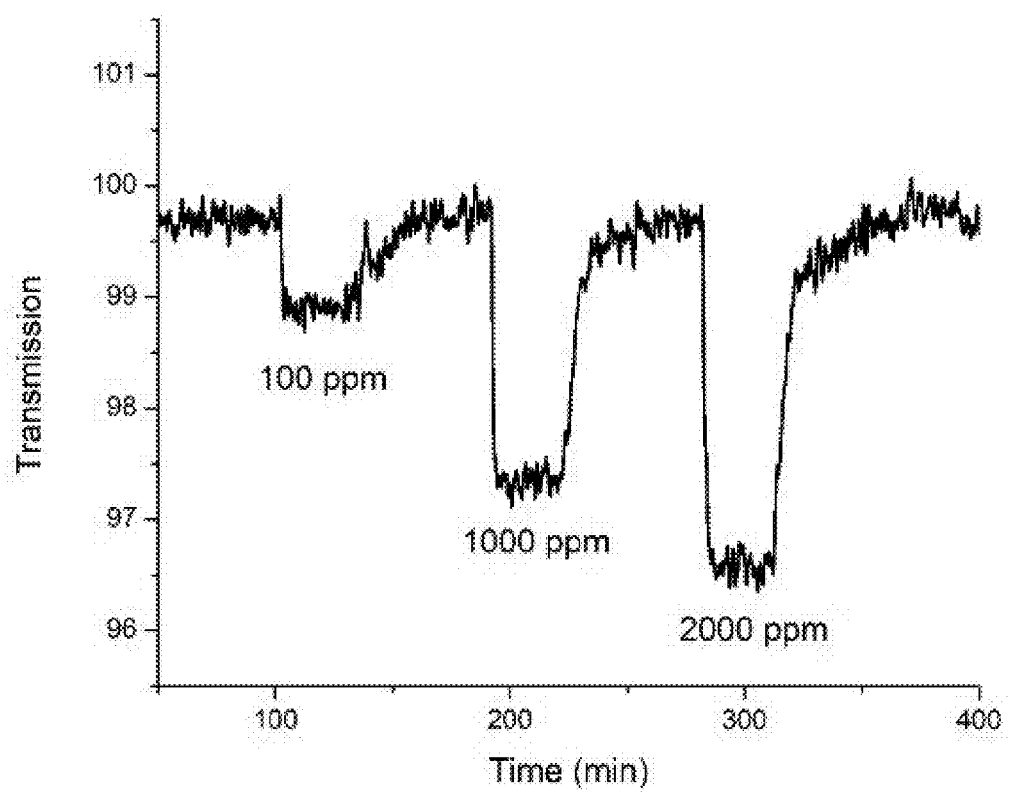
FIG. 10 depicts the $H_2$ sensing response transmission at 590 nm as a function of time.

FIG. 9 illustrates the transmission spectra for varying levels of $H_2$ in a balance of $N_2$ at room temperature. The sensor demonstrates a broadband reduction in transmission with increasing $H_2$ concentrations from 100 to 2000 ppm. The wavelength of 600 nm at the spectra valley was selected and the associated transmission intensity was plotted as a function of $H_2$ concentrations (FIG. 10). The concept of Pd-based $H_2$ sensing has been well studied in Pd thin films. Briefly, the interaction between Pd and $H_2$ leads to a decrease in the magnitude of the real and imaginary parts of the dielectric constant of the Pd complex with increasing $H_2$, which is caused by the volume expansion and free electrons reduction in Pd lattice. For an aggregate of small metallic nanoparticles embedded in a matrix phase such as Pd-$SiO_2$ composite, previous studies employed Maxwell-Garnett theory to simulate the magnitude and wavelength dependence of the expected response of Pd/$SiO_2$ in the presence of $H_2$ under ambient conditions. In contrast to results obtained from the monolithic Pd films, an increase in both the real and imaginary part of the effective refractive indices in response to $H_2$ exposure was predicted for the Pd/$SiO_2$ nanocomposite films. Simulated transmittance results for a 400 nm thick film of Pd/$SiO_2$ demonstrated a broadband reduction in nanocomposite film transmittance and an effective increase in film absorbance in response to $H_2$ exposure.

Figure 11:
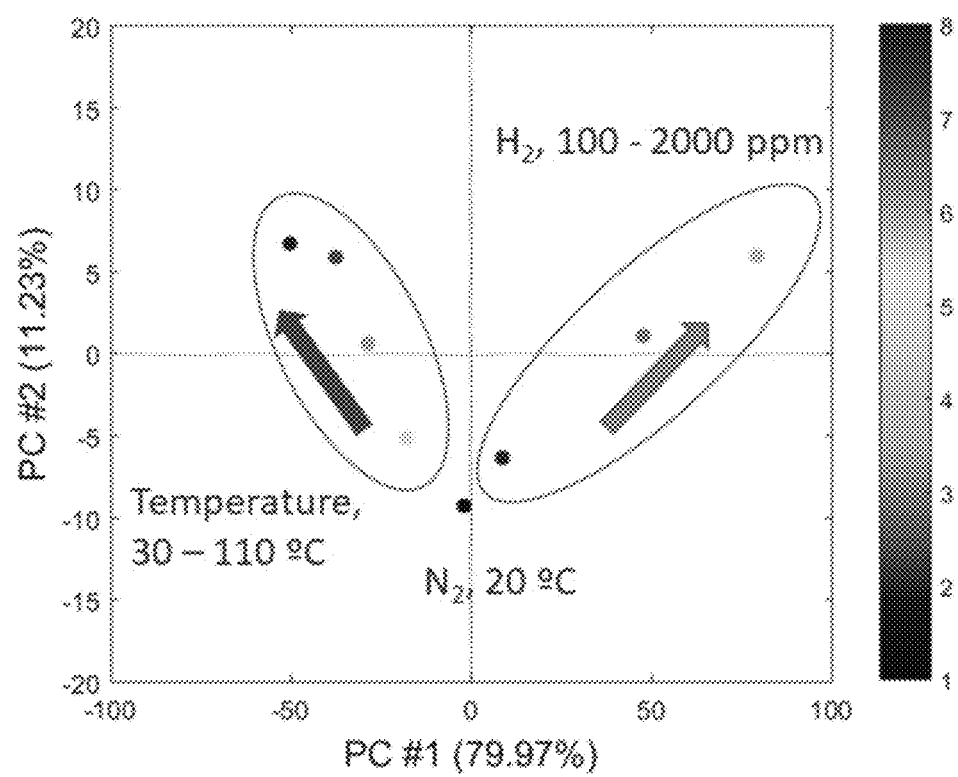
FIG. 11 depicts a PCA plot of individual temperature and $H_2$ sensing.

Since the sensor exhibited unique wavelength dependences of the variation of transmission intensity in response to the temperature and $H_2$, discrimination between the two analytes were examined using PCA. The transmission spectra of different concentrations of $H_2$ and elevated temperatures were analyzed in the 500-600 nm wavelength region. The two clusters of $H_2$ and temperature were clearly separated by PC #1 in the PCA plot suggesting the potential for discrimination by multiple wavelength interrogation (FIG. 11). The evolution trend of $H_2$ concentrations and temperatures could also be tracked, respectively.

Figure 12:
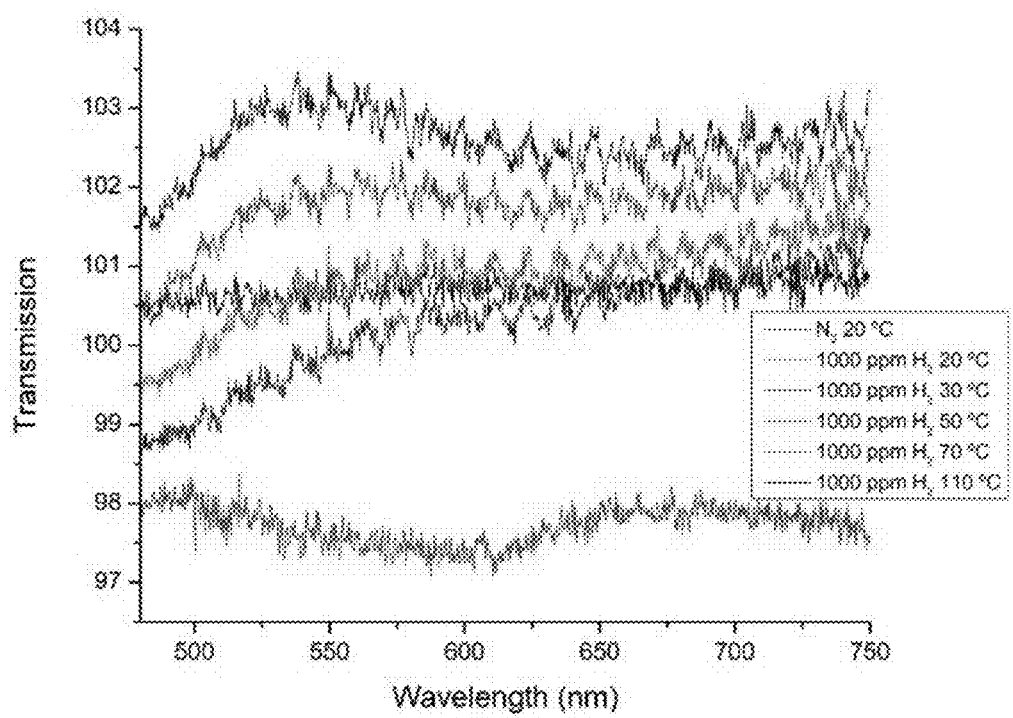
FIG. 12 depicts the transmission spectra of varying temperatures in the presence of 1000 ppm $H_2$.
Figure 13:
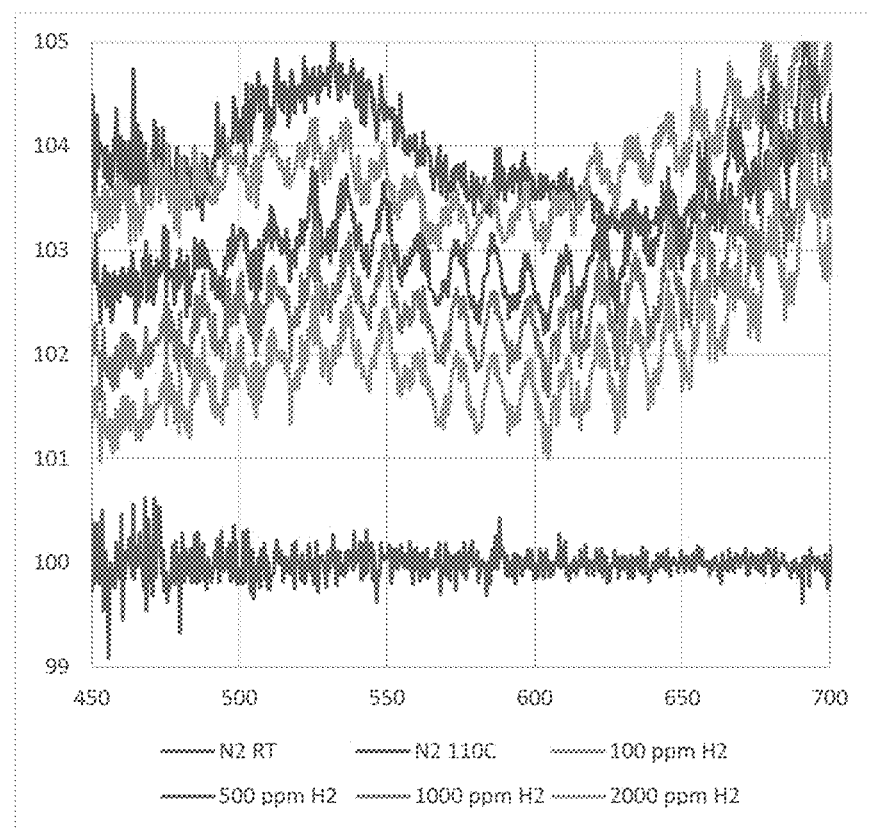
FIG. 13 depicts the transmission spectra of varying $H_2$ concentration 110° C.

Based on the individual temperature and $H_2$ sensing responses, it is clear that independent signals can be distinguished by multiple wavelength interrogation techniques due to the unique nature and wavelength dependences of the responses. Previous studies for Au/$SiO_2$ films alone at high temperatures also suggested that simultaneous temperature and gas sensing can be achieved based on the wavelength dependence using multiple or broadband wavelength interrogation. For the sensors investigated in the current study, combined temperature and $H_2$ sensing experiments were firstly performed with elevated temperatures from 20 to 110° C. in the presence of 1000 ppm $H_2$. As shown in the optical transmission spectra (FIG. 12), a broad band reduction in transmission was generated in the presence of $H_2$ at RT. A band from 500-600 nm with a peak maximum at ~525 nm gradually appeared with increasing temperatures due to the Au LSPR absorption peak. Increasing temperatures also had an opposite effect on the film transmission intensity as compared to $H_2$ over the entire wavelength range which may result from a combined effect of Pd/$SiO_2$ and Au/$SiO_2$ films at increasing temperatures. In addition to varying temperatures in a fixed concentration of 1000 ppm $H_2$, different concentrations of $H_2$ was then tested at 110° C. and the corresponding transmission spectra is shown in FIG. 13. After an immediate appearance of the Au LSPR peak at 110° C. in $N_2$, increasing $H_2$ concentrations at 110° C. lead to a reduction in transmission preferentially in the vicinity of the LSPR absorption peak of Au which resulted predominantly from the interaction between Pd/$SiO_2$ and $H_2$.

Figure 14:
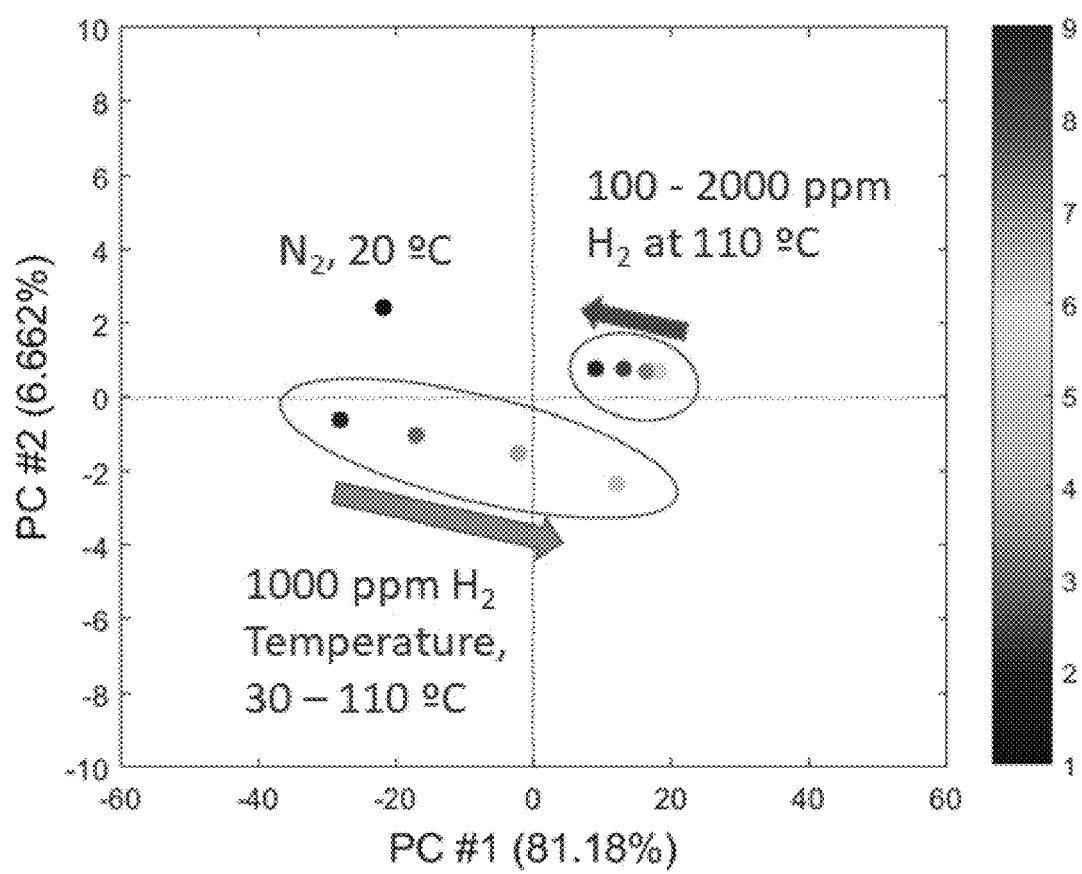
FIG. 14 depicts the PCA plot of combined temperature and $H_2$ sensing results.
Figure 15:
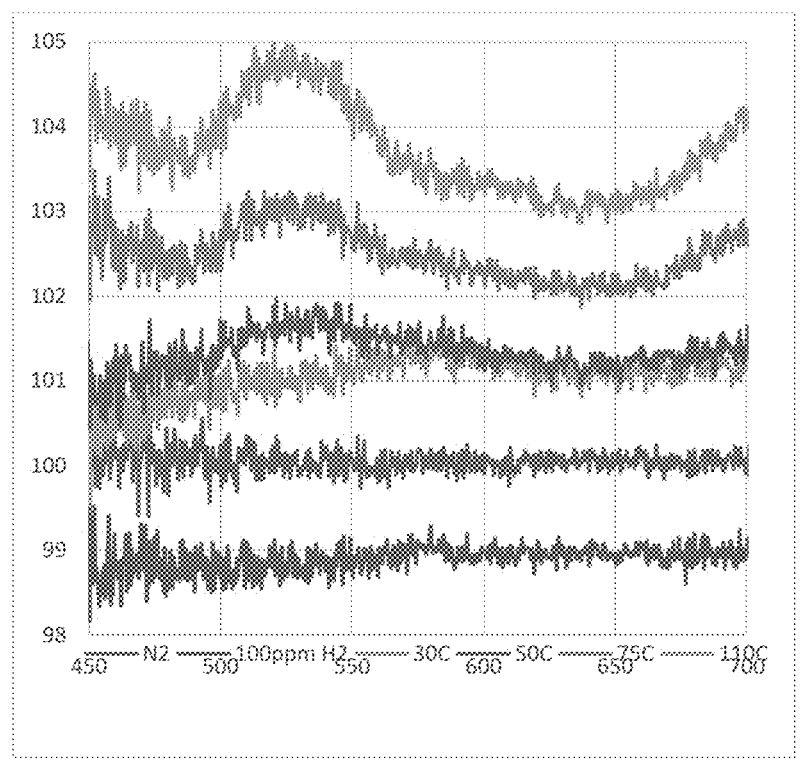
FIG. 15 depicts the transmission spectra of temperatures in the presence of fixed $H_2$ concentration.
Figure 16:
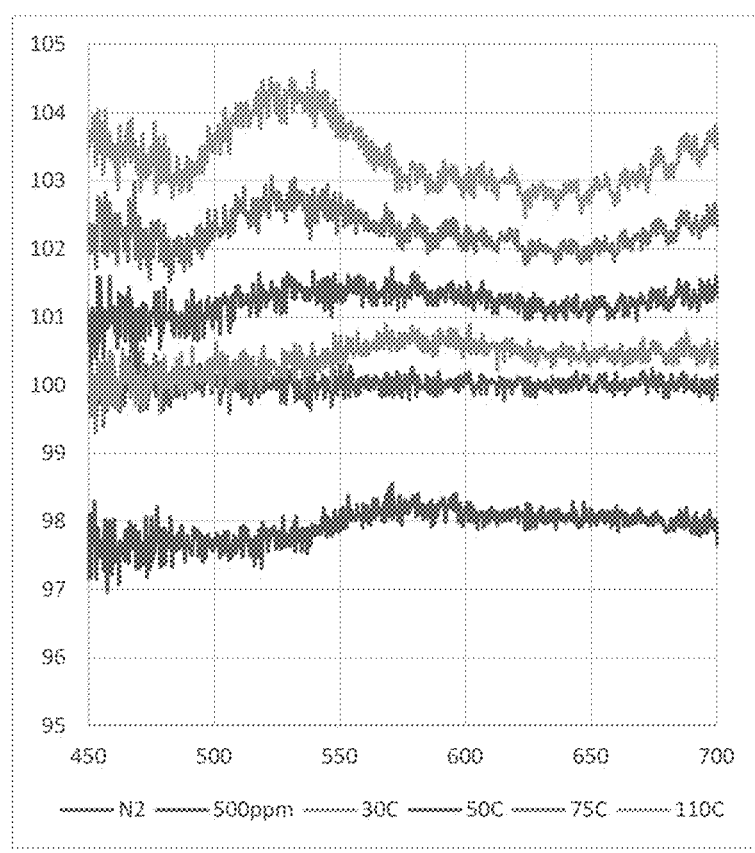
FIG. 16 depicts another transmission spectra of temperatures in the presence of fixed $H_2$ concentration.
Figure 17:
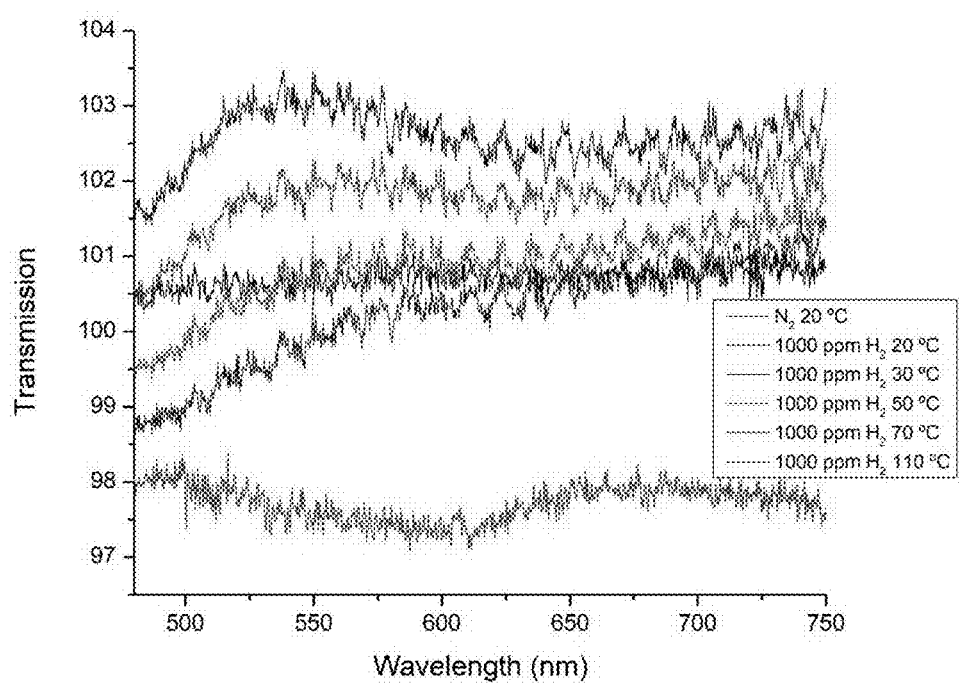
FIG. 17 depicts still another transmission spectra of temperature in the presence of fixed $H_2$ concentration.
Figure 18:
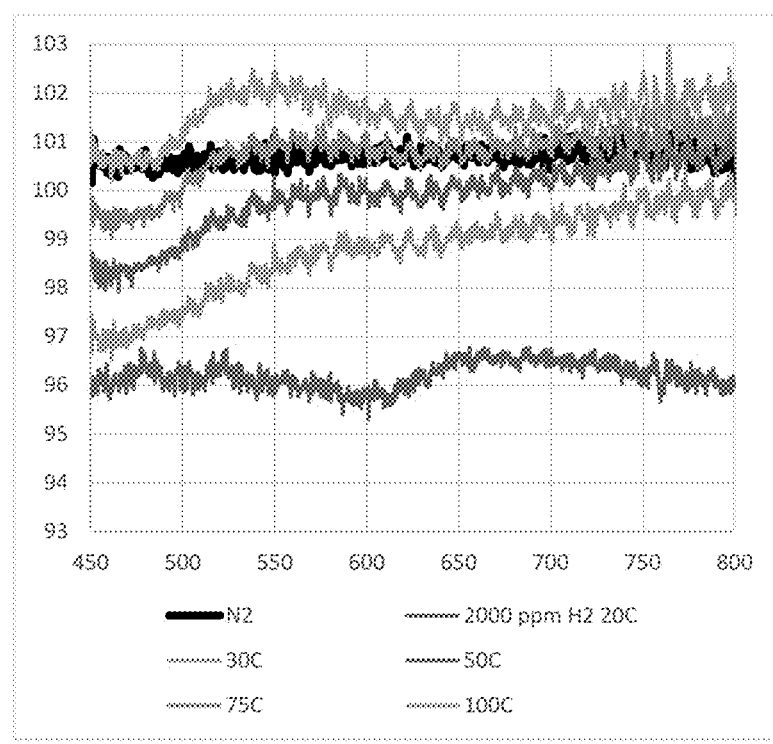
FIG. 18 depicts yet another transmission spectra of temperature in the presence of fixed $H_2$ concentration.
Figure 19:
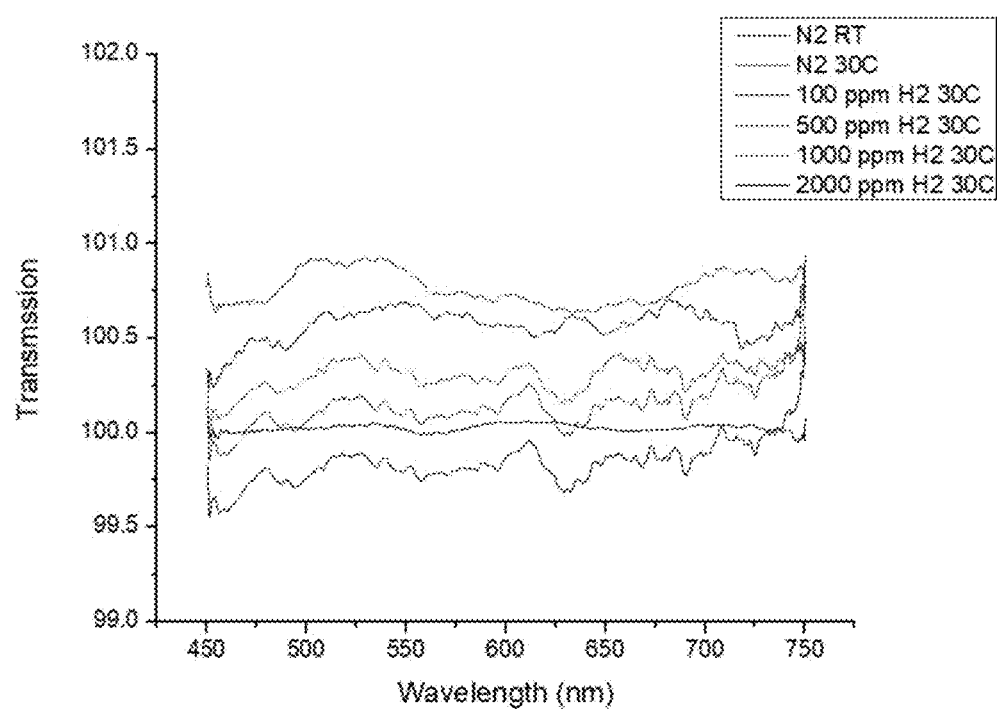
FIG. 19 depicts the transmission spectra of an $H_2$ concentrations at a fixed temperature.
Figure 20:
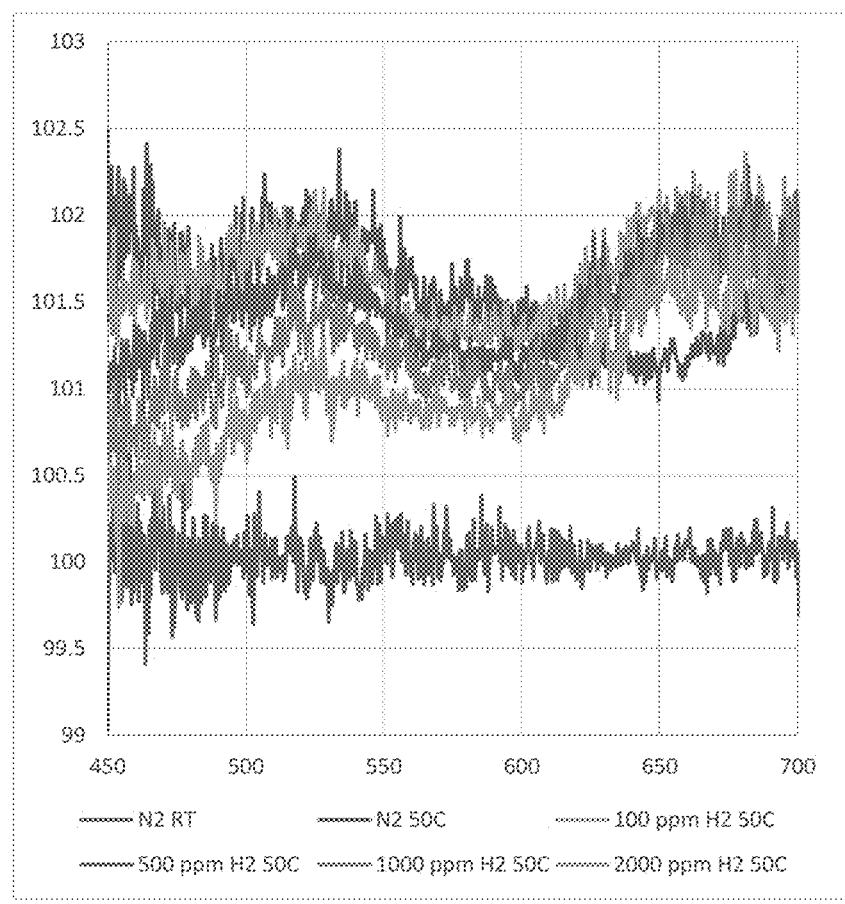
FIG. 20 depicts another transmission spectra of an $H_2$ concentrations at a fixed temperature.
Figure 21:
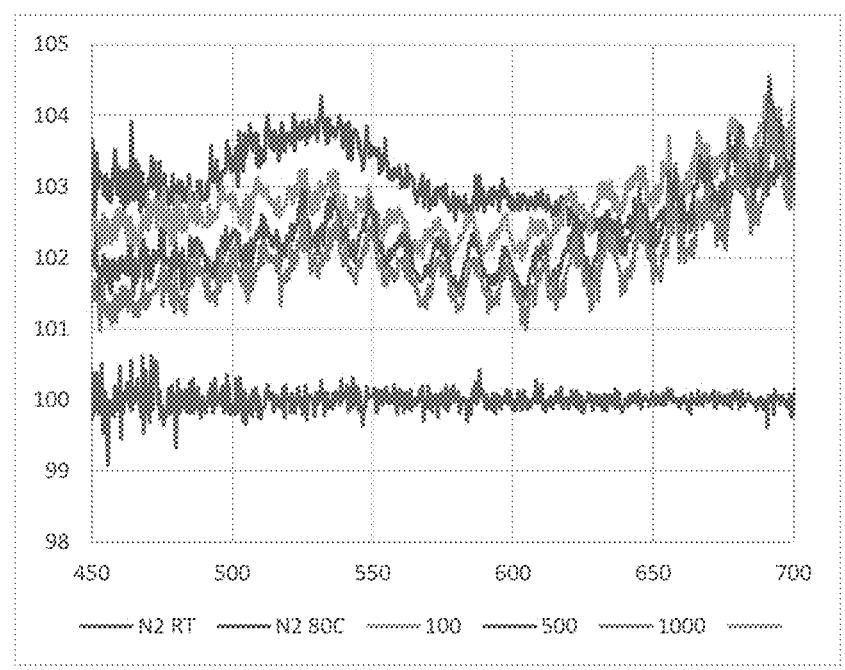
FIG. 21 depicts yet another transmission spectra of an $H_2$ concentrations at a fixed temperature.
Figure 22:
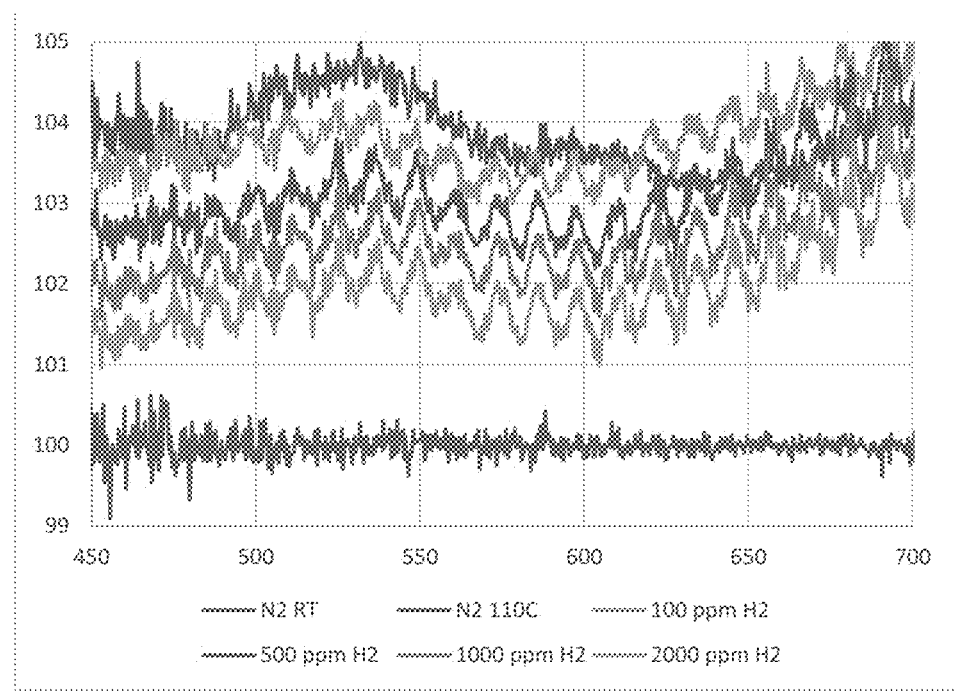
FIG. 22 depicts still another transmission spectra of an $H_2$ concentrations at a fixed temperature.

Previous studies reported a shift of Au LSPR peak to shorter wavelengths under high temperature and reducing gas environment, which caused an increase in the density of free carriers in Au or a decrease in the dielectric constant of the matrix phase. Therefore, the temperature or $H_2$ induced signal change can be distinguished by the change of Au LSPR peak. The transmission spectra of the combined sensing was analyzed in the 500-600 nm wavelength region by PCA (FIG. 14). The two clusters of $H_2$-induced and temperature-induced combined sensing were clearly separated in the PCA plot showing the potential for distinguishing between these two parameters simultaneously.

For the application in a more complex environment, embodiments were tested in various conditions by varying $H_2$ concentrations and temperatures at the same time. Two sets of experiments were designed: 1) the $H_2$ concentration was maintained a specific level (200, 500, 1000, 2000 ppm) and the temperature was gradually increased from RT to 110° C.; 2) the temperature was maintained at a specific level (20° C., 30° C., 50° C., 80° C., 110° C.) and the $H_2$ concentration was gradually increased from 200 to 2000 ppm.

FIGS. 15-18 illustrate the transmission spectra of the first set. The change of transmission intensity of each figure followed the trend described above in FIG. 12. The Au LSPR peak was distinct and narrow in the presence of low levels of $H_2$, while it became broad and obscured by the $H_2$ response in the presence of high levels of $H_2$.

The transmission spectra of the second set is illustrates FIG. 19-22. At high temperatures, the Au LSPR peak dominated the overall spectrum even in the presence of 2000 ppm $H_2$. The $H_2$-induced response generally broadens the peak width and reduces the transmission intensity.

In the sensing data disclosed herein, each measurement consists of a single spectrum, taken at a fixed gas concentration and sensor temperature. The dimensionality of the raw data corresponds to the number of pixels over which the spectrum is measured. Spectra with varying concentration and temperature values were collected and analysis was performed using the PCA function built-in to the MATLAB Statistics and Machine Learning Toolbox. The raw data is initially defined in terms of normalized transmitted intensity through the fiber (T); prior to performing PC analysis, the spectrum was first mapped into absorbance ($\log(1/T)$). Using this approach, the contributions from different, independent absorption mechanisms linearly sum to produce the total spectrum, in the raw transmission data these mechanisms would contribute multiplicatively. PCA operates based on a linear decomposition of the data, so this approach makes it more likely uncorrelated absorption mechanisms will separate into different principal components.

The transmission spectra of the combined sensing in FIGS. 15-22 were analyzed in the 500-650 nm wavelength region by PCA. Some hysteresis was observed where the spectrum of the same H2/temperature condition did not match each other between the two sets of results (data not shown). Although a clear pattern for all combined sensing results in PCA was not obtained, it was found that a significant majority of the variance is explained by the first principal component (91.9% for the sensor array). The higher order PC scores don't seem particularly correlated to temperature or concentration, suggesting most of the useful information is included in PC #1.

Figure 23:
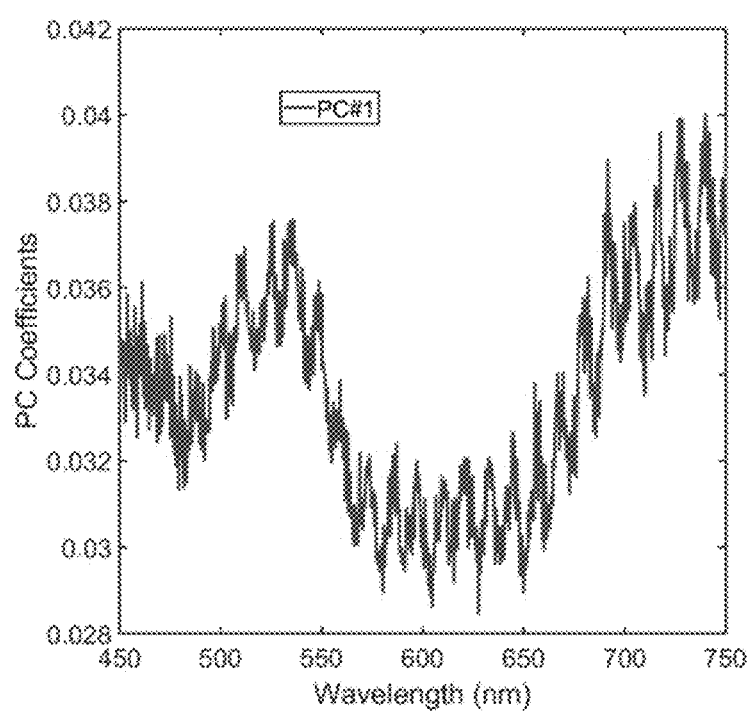
FIG. 23 illustrate the principal component analysis of temperature and gas sensing data where the coefficients of the first principal component as a function of wavelength.
Figure 24:
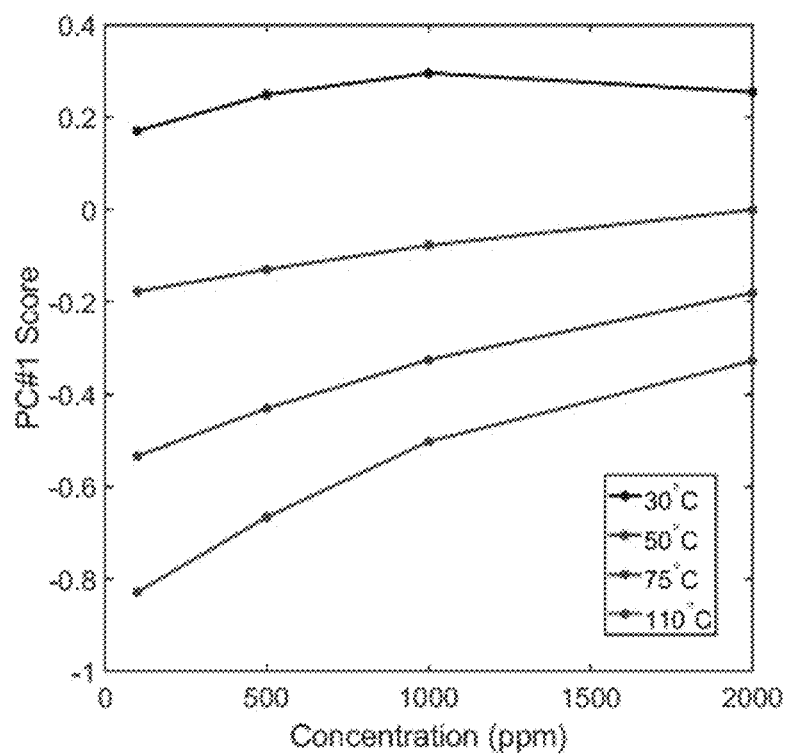
FIG. 24 illustrate the principal component analysis of temperature and gas sensing data where the first principal component score as a function of hydrogen concentration (at fixed temperature)
Figure 25:
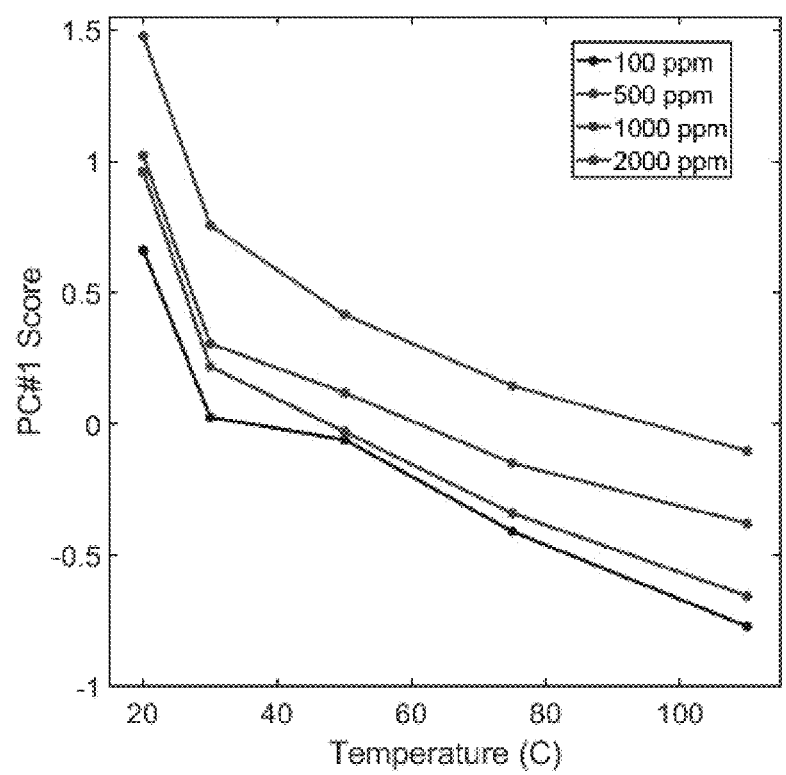
FIG. 25 illustrate the principal component analysis of temperature and gas sensing data where the s a function of temperature with fixed hydrogen concentration.
Figure 26:
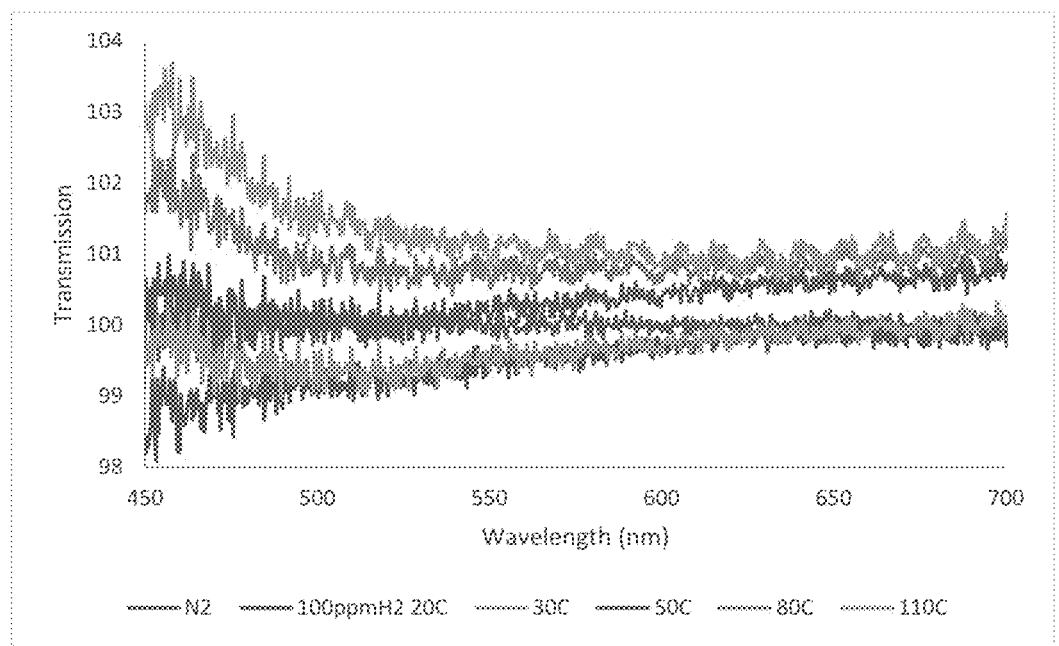
FIG. 26 illustrates the combined sensing performance of $Pd/SiO_2$ at one temperature at a fixed H2 concentration.
Figure 27:
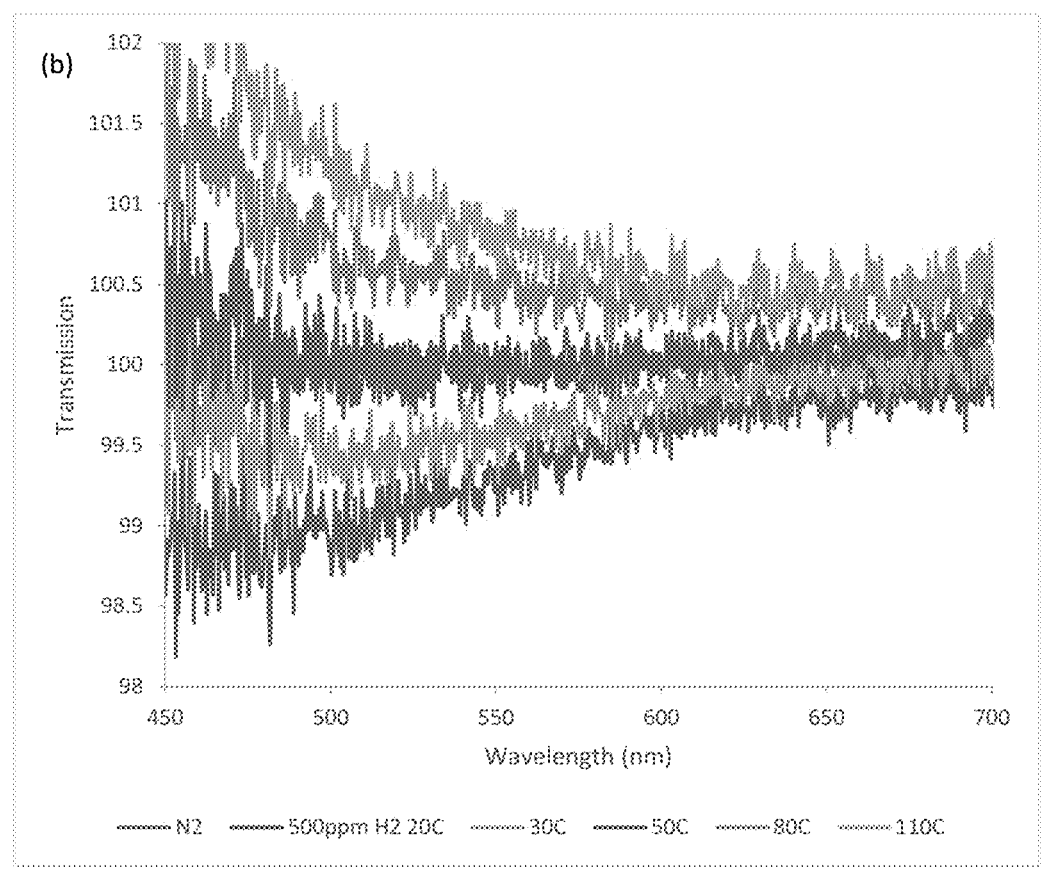
FIG. 27 illustrates the combined sensing performance of $Pd/SiO_2$ at one temperature at a fixed H2 concentration.
Figure 28:
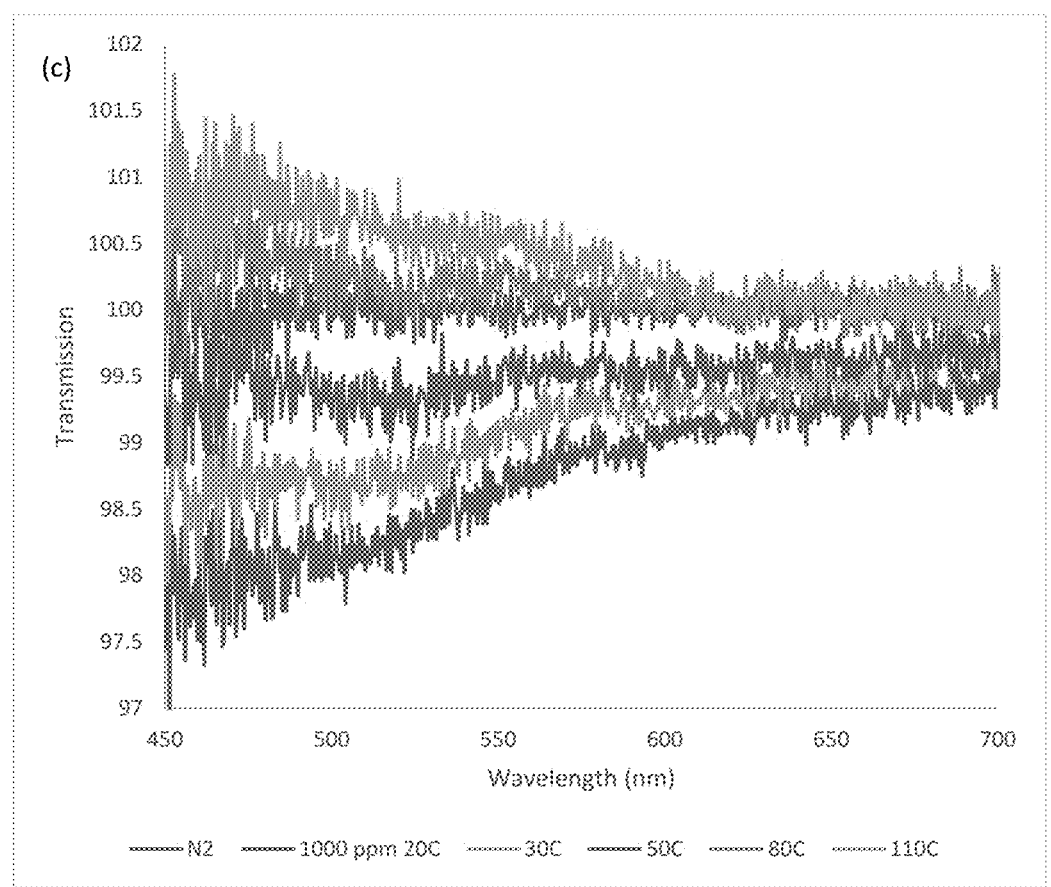
FIG. 28 illustrates the combined sensing performance of $Pd/SiO_2$ at one temperature at a fixed H2 concentration.
Figure 29:
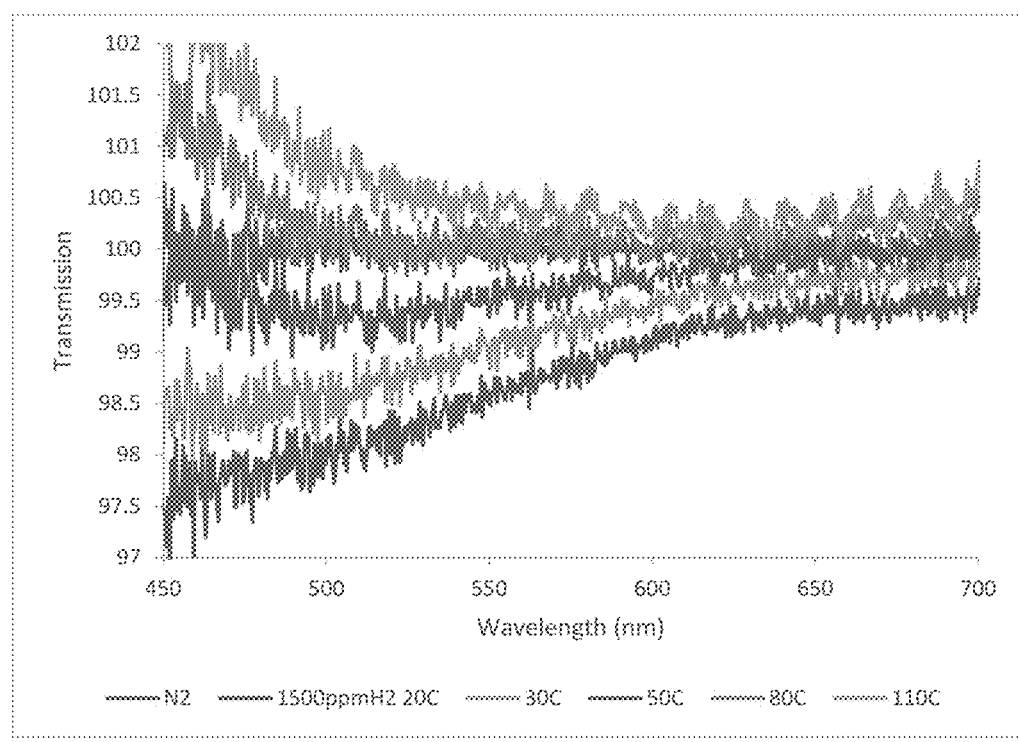
FIG. 29 illustrates the combined sensing performance of $Pd/SiO_2$ at one temperature at a fixed H2 concentration.
Figure 30:
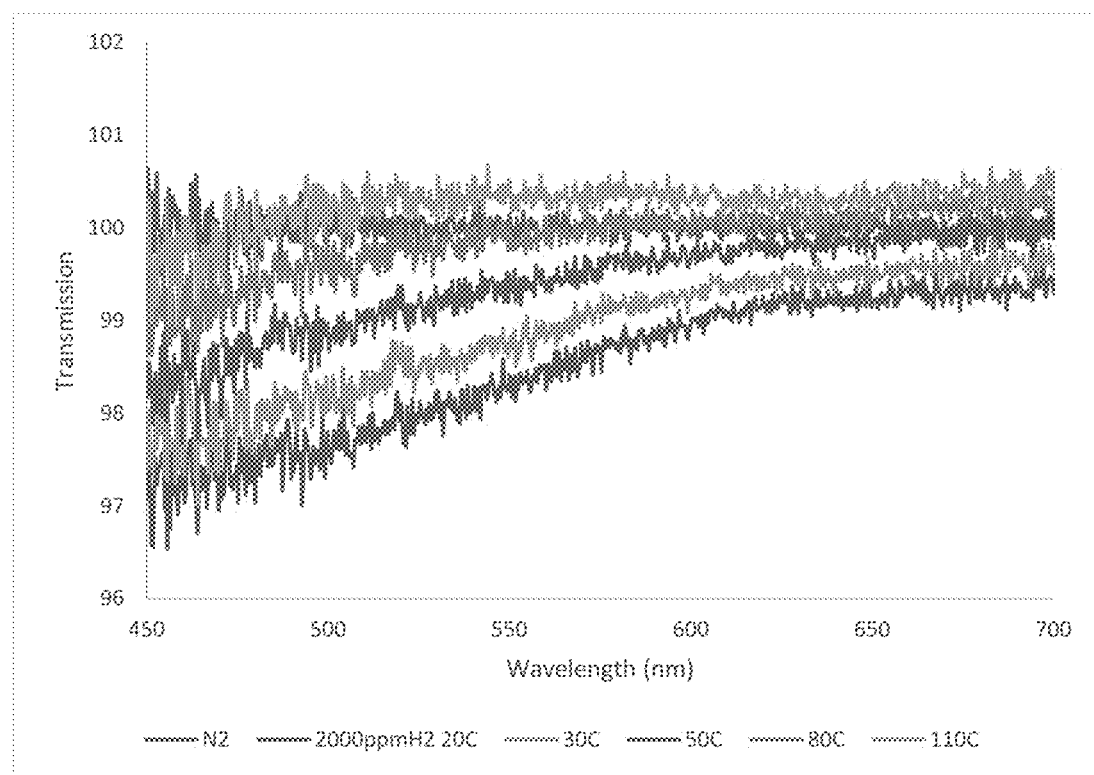
FIG. 30 illustrates the combined sensing performance of $Pd/SiO_2$ at one temperature at a fixed H2 concentration.
Figure 31:
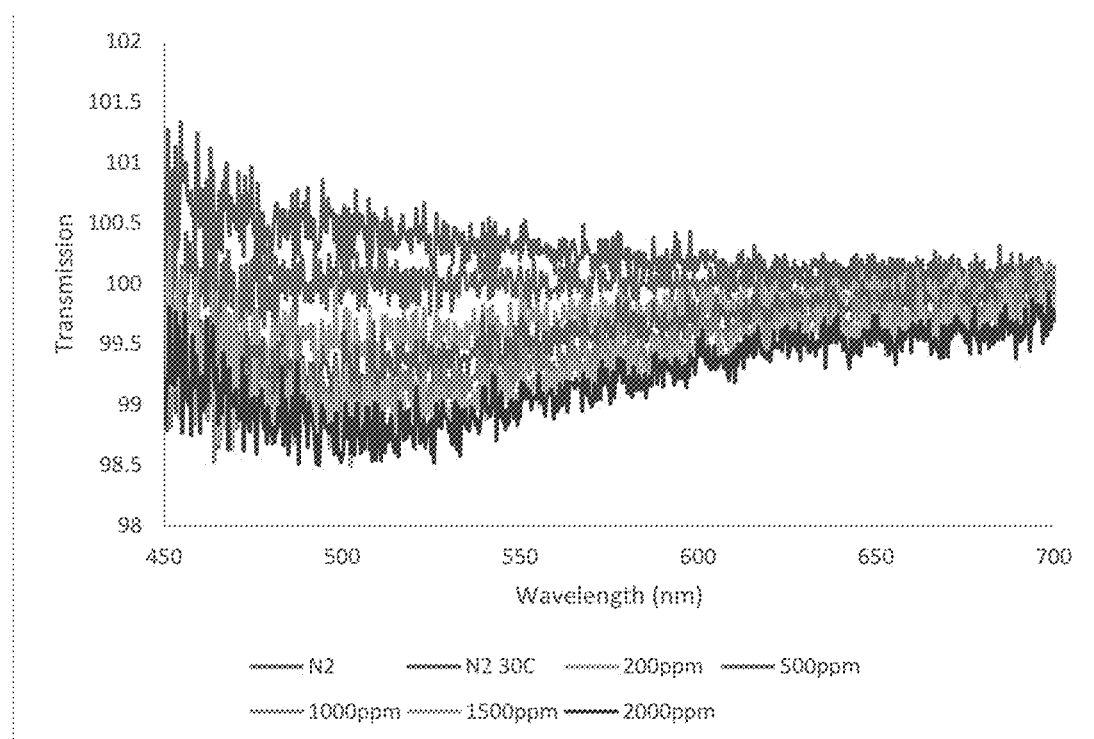
FIG. 31 illustrates the combined sensing performance of $Pd/SiO_2$ by varying H2 concentrations at a fixed temperature.
Figure 32:
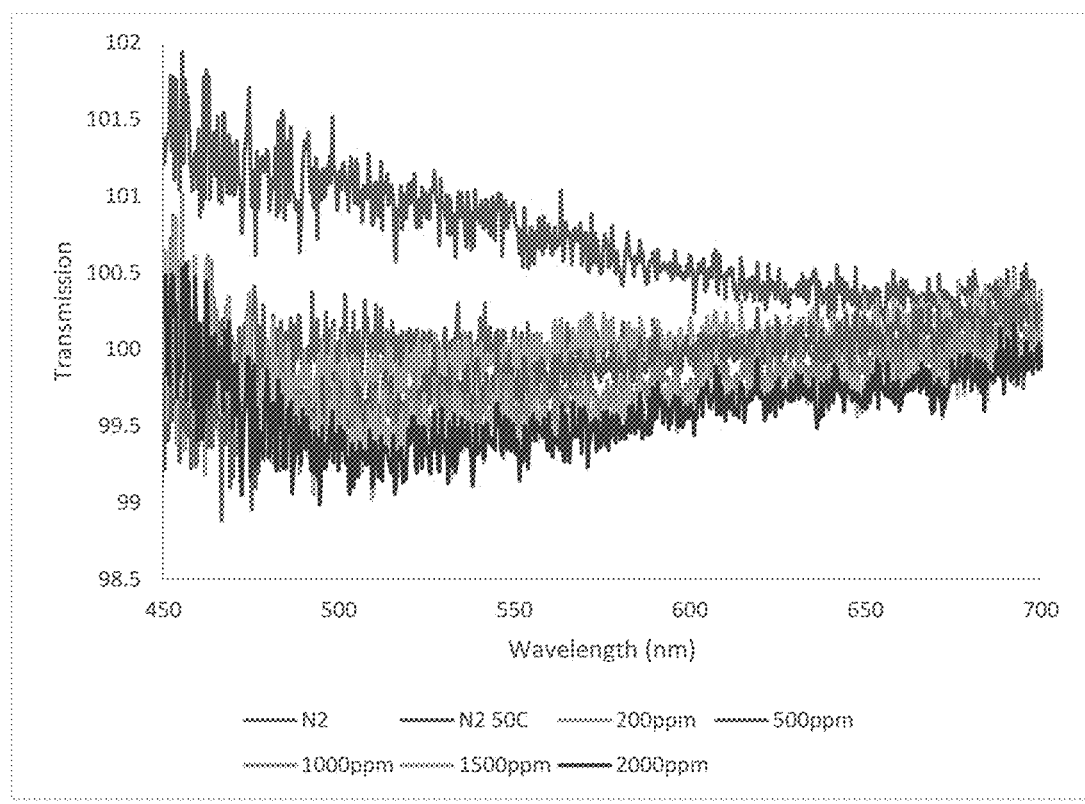
FIG. 32 illustrates the combined sensing performance of $Pd/SiO_2$ by varying H2 concentrations at a fixed temperature.
Figure 33:
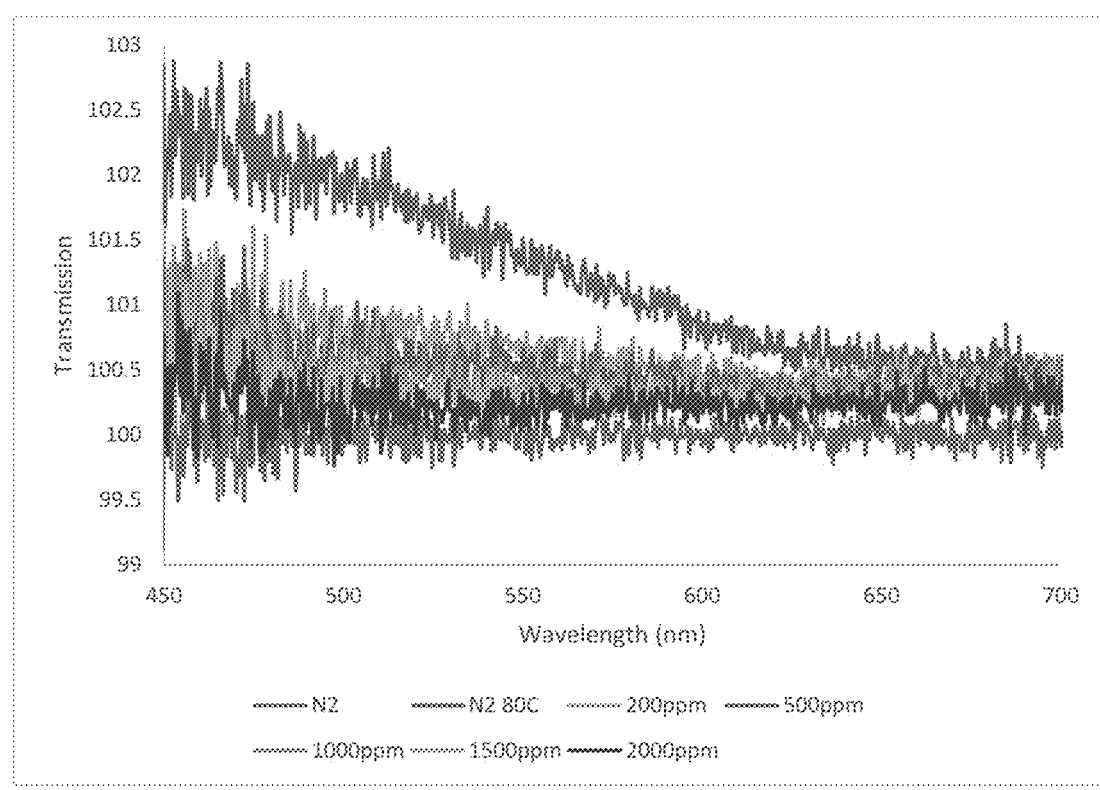
FIG. 33 illustrates the combined sensing performance of $Pd/SiO_2$ by varying H2 concentrations at a fixed temperature.
Figure 34:
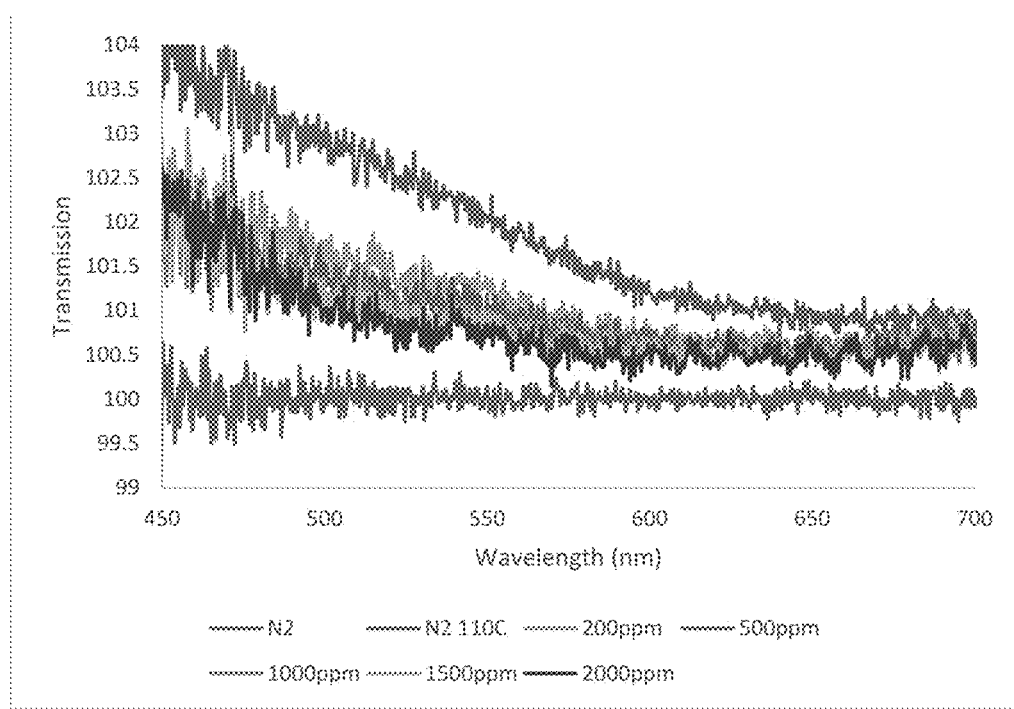
FIG. 34 illustrates the combined sensing performance of $Pd/SiO_2$ by varying H2 concentrations at a fixed temperature.

In FIG. 23, the coefficients of the first principle component within the original basis are displayed for the sensor array. Physically, this set of coefficients indicate the change in the absorbance spectrum that occurs as the first principal component varies. The position of an individual measurement along a particular principal component axis is referred to as the score. The score of the first principal component is shown for two sub-sets of the data analyzed—in FIG. 24, the score is plotted as a function of concentration for several fixed temperatures, and in FIG. 25, the score is plotted as a function of temperature at fixed hydrogen concentration. The coefficients indicate that the most significant changes in the spectrum are peaked near 520-530 nm. The score associated with this PC tracks the temperature series (fixed concentration) somewhat well and concentration series (fixed temperature) very well.

In previous studies, simultaneous temperature and gas sensing of Au—$SiO_2$ films under extreme temperature conditions was investigated. The Pd—$SiO_2$ based film also demonstrated rapid responses to 2%-100% $H_2$ at elevated temperatures of 200 and 400° C.

In order to verify the sensing performance of a single sensing element in the current near-ambient conditions, a Pd/$SiO_2$ film coated fiber optic sensor was first exposed to various low-level of $H_2$ concentrations and temperatures. Transmission spectra of varying temperatures at a fixed $H_2$ concentration was recorded in FIGS. 26-30. A broad band reduction in transmission from 450-650 nm was observed due to the interaction between Pd and $H_2$ at the beginning. With elevated temperatures from 20 to 110° C. in the presence of the fixed $H_2$ concentration, the transmission intensity of this broad band gradually increased. In the previous study, it was observed a reduced $H_2$ response magnitude at elevated temperatures of 200 and 400° C. as compared to near-ambient measurements. These observations are due in part to the increasing importance of reversible oxidation and reduction of Pd-based nanoparticles at elevated temperatures.

In previous studies, simultaneous temperature and gas sensing of Au—$SiO_2$ films under extreme temperature conditions was investigated. The Pd—$SiO_2$ based film also demonstrated rapid responses to 2%-100% $H_2$ at elevated temperatures of 200 and 400° C.

In order to verify the sensing performance of a single sensing element in the current near-ambient conditions, a Pd/$SiO_2$ film coated fiber optic sensor was first exposed to various low-level of $H_2$ concentrations and temperatures. Transmission spectra of varying temperatures at a fixed $H_2$ concentration was recorded in FIGS. 26-30. A broad band reduction in transmission from 450-650 nm was observed due to the interaction between Pd and $H_2$ at the beginning. With elevated temperatures from 20 to 110° C. in the presence of the fixed $H_2$ concentration, the transmission intensity of this broad band gradually increased. In the previous study, a reduced $H_2$ response magnitude at elevated temperatures of 200 and 400° C. was observed as compared to near-ambient measurements. These observations are due in part to the increasing importance of reversible oxidation and reduction of Pd-based nanoparticles at elevated temperatures.

Transmission spectra of varying $H_2$ concentrations at a fixed temperature is illustrated in FIGS. 31-34. A broad band from 450-650 nm appeared when the temperature was raised. Increasing $H_2$ concentrations at this temperature lead to a reduction in transmission intensity of this broad band. At low temperatures from 30 to 50° C., the response of $H_2$ dominated and a broad band was observed below the $N_2$ baseline. While at higher temperatures from 80 to 110° C., the temperature effect dominated and the transmission spectra with reduced intensity was observed above the $N_2$ baseline.

Figure 35:
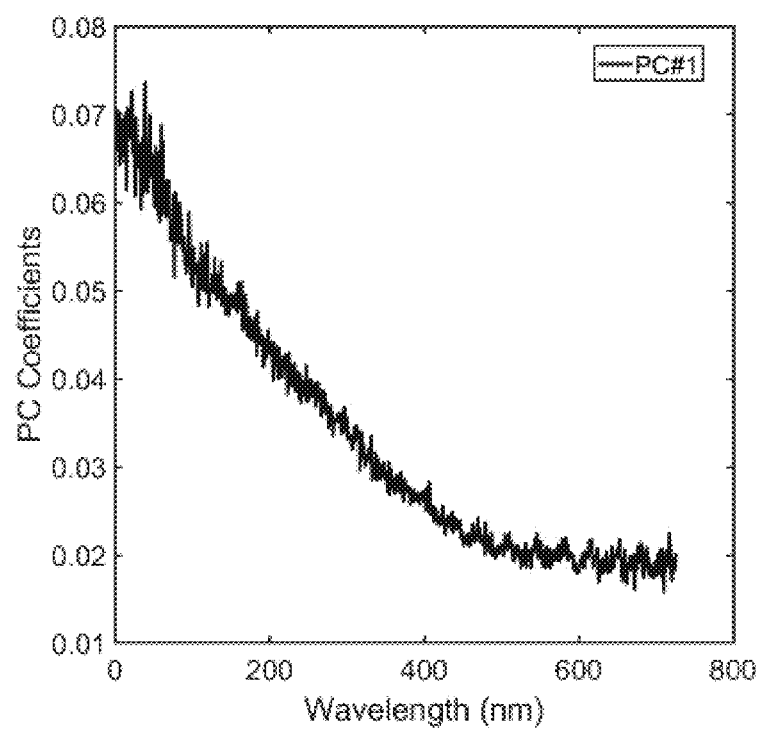
FIG. 35 illustrates the principal component analysis of temperature and gas sensing data of the coefficients of the first principal component as a function of wavelength.
Figure 36:
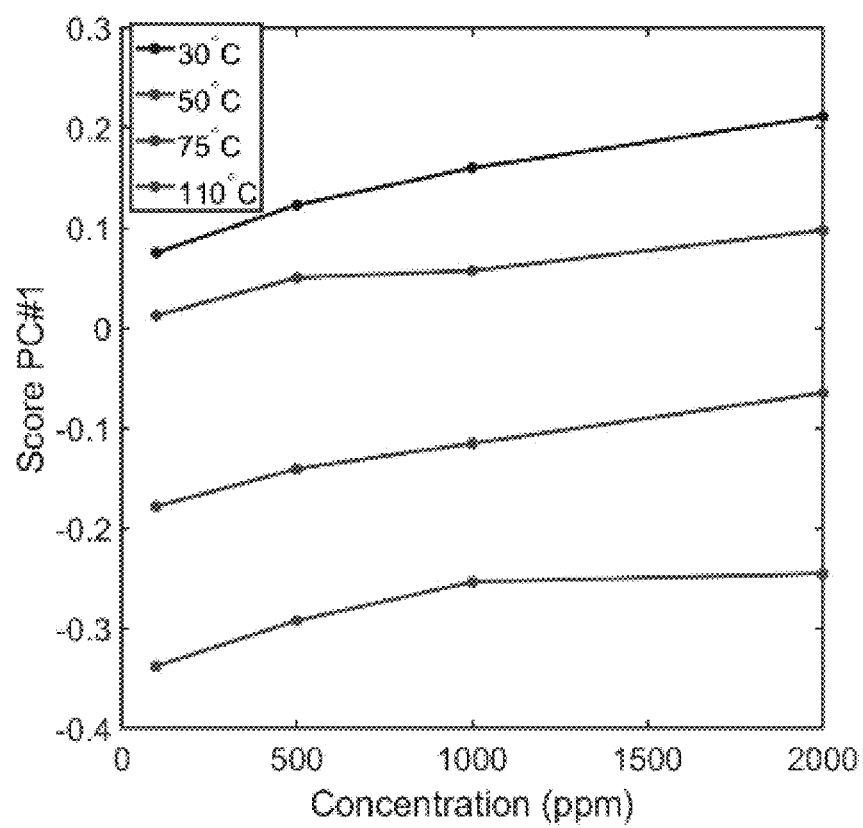
FIG. 36 illustrates the principal component analysis of temperature and gas sensing data of the first principal component score as a function of hydrogen concentration (at fixed temperature)
Figure 37:
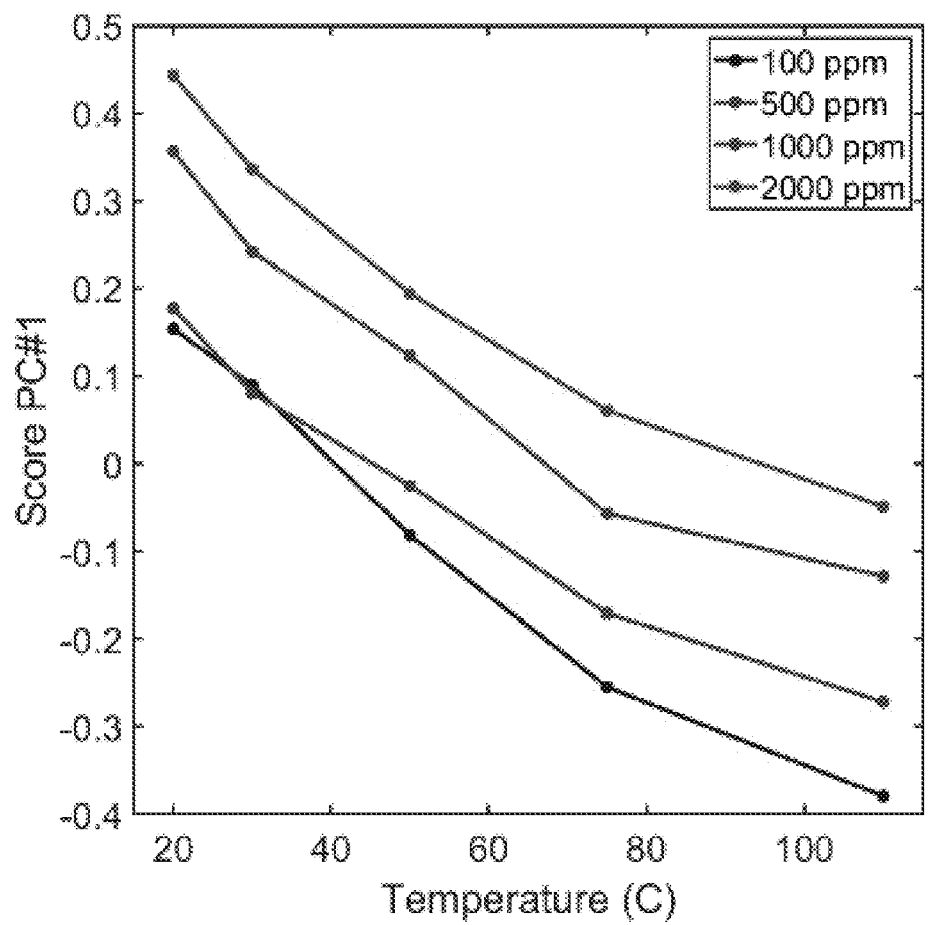
FIG. 37 illustrates the principal component analysis of temperature and gas sensing data of the first principal component as a function of temperature with fixed hydrogen concentration.

By analyzing the 450-650 nm wavelength region in PCA, 93.7% of the variance is also explained by the first principal component. The first PC coefficients within the original representation are shown (FIG. 35), along with variation of the first-principal component scores with varying concentration at fixed temperature (FIG. 36) and with varying temperature at fixed concentration (FIG. 37). The coefficients of the Pd/$SiO_2$ data indicate that the most significant changes in the spectrum are peaked near 450 nm. The score associated with this PC tracks the temperature series (fixed concentration) very well and concentration series (fixed temperature) somewhat well.

The Pd nanoparticles do not show LSPR features when the particle size is less than 10 nm, while the LSPR peak of some Pd nanostructures with larger sizes (>25 nm) could appear in the visible region by tailoring the shape. For example, the LSPR peaks of Pd nanocubes with outer diameters of 48 nm could be tuned form 410 nm to 520 nm by empting their interiors. The Pd nanoplates of 28 nm in edge length exhibited a broad LSPR band around 520 nm. In the meantime, the LSPR peaks of previously reported Pd nanostructures are all relatively broad covering 300-600 nm, which matches well with the location of our temperature-induced band in the measured spectrum of $Pd/SiO_2$ film. From the SEM image shown in Figure, the Pd NPs embedded with the silica matrix demonstrated a size distribution from 5 to 30 nm, which lead to the size-dependent LSPR properties. Therefore, the overall temperature sensing response of the sensor array is dominated by $Au/SiO_2$LSPR peak with significant contributions from the $Pd/SiO_2$ film in the 450-600 nm region. This could also explain the spectrum hysteresis in the two sets of experiments shown in FIGS. 15-22. In the first set, the $H_2$ response at RT was first generated by Pd reaction. Then the evolution of the spectrum was induced by the synergic effect of Pd and Au when the temperatures were gradually increased. However, when the temperature was increased to a specific level at the beginning in the second set, both Pd and Au contributed to the first spectrum change. Then increasing levels of $H_2$ were gradually introduced, the signal changes were induced solely by Pd. Even though two spectrums with the same $H_2$ concentration and temperature condition can be picked up from the two set, the absorption bands could show considerable difference caused by the different test sequences.

Figure 38:
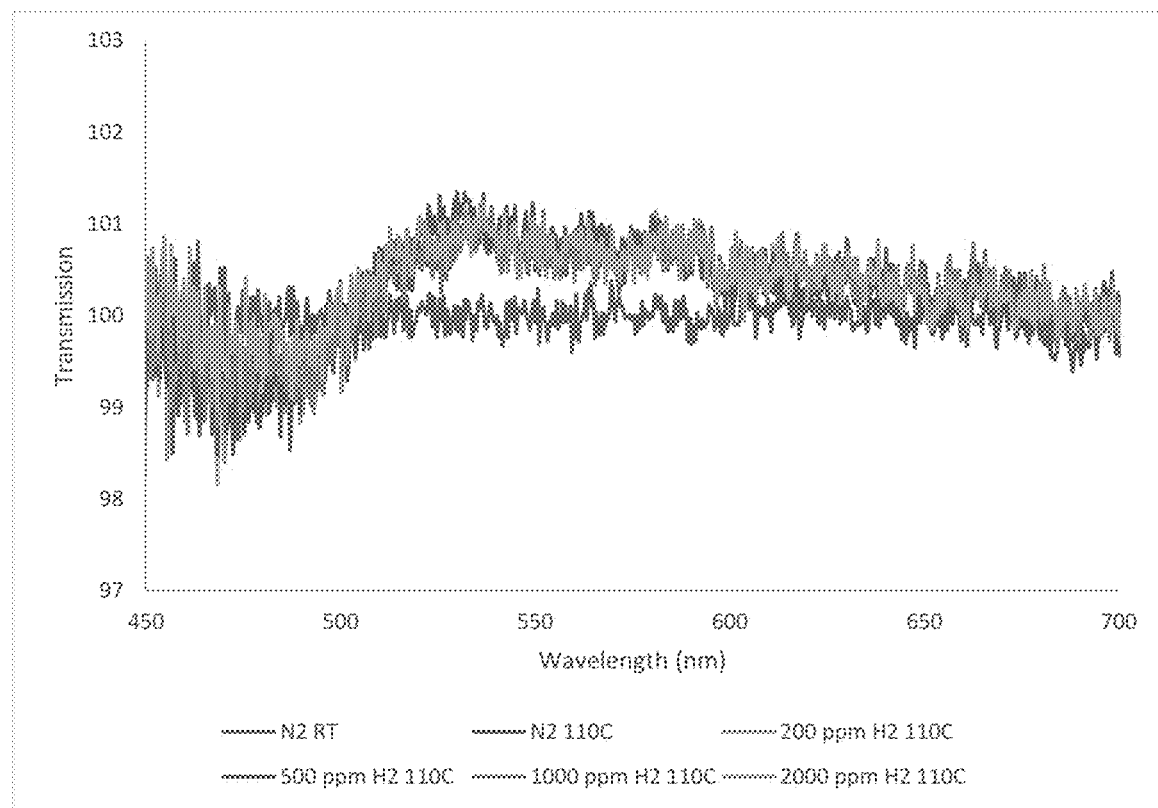
FIG. 38 illustrates the combined sensing performance of $Au/SiO_2$ by (a) varying H2 concentrations at 110° C.
Figure 39:
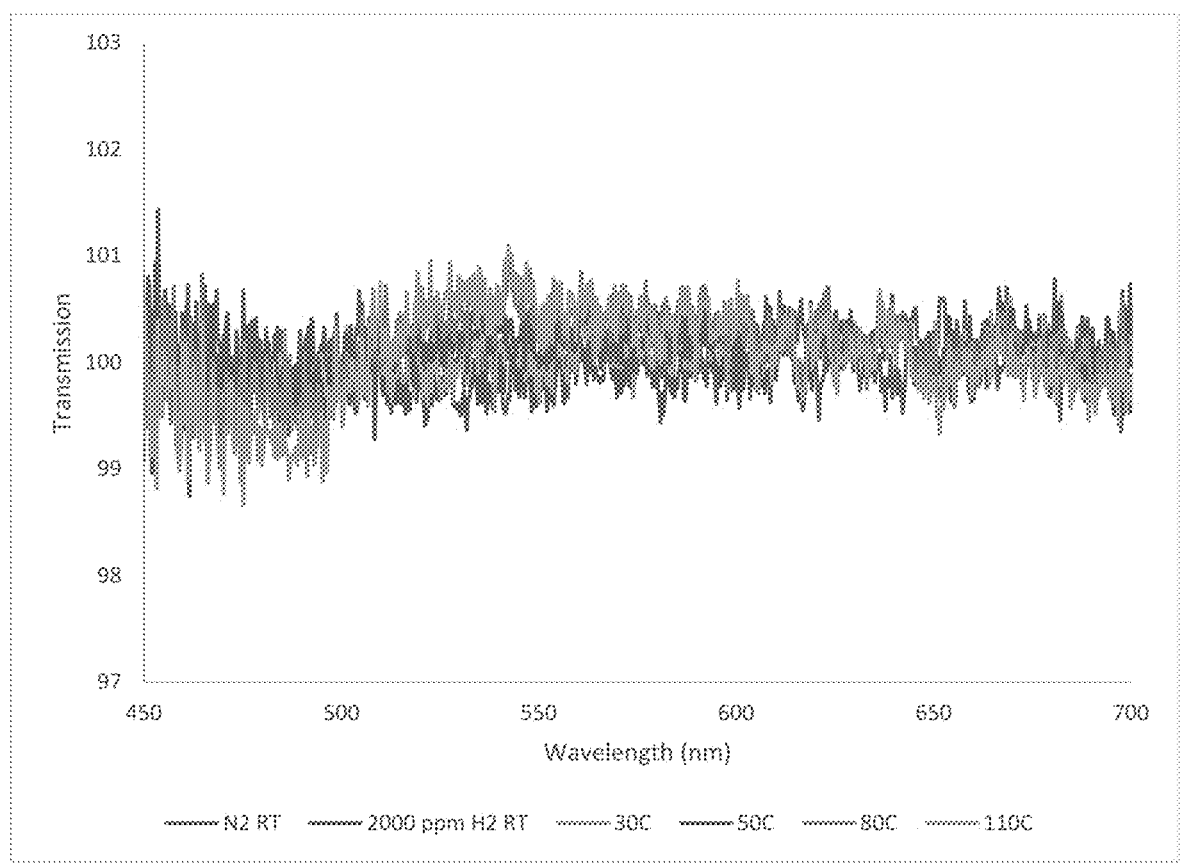
FIG. 39 illustrates the combined sensing performance of $Au/SiO_2$ by (b) varying temperatures in 2000 ppm H2.

In addition, a single $Au/SiO_2$ film coated fiber optic sensor was exposed to different sensing conditions. A broad band from 500-600 nm with a peak maximum at ~525 nm due to the Au LSPR absorption peak was observed when the temperature was raised to 110° C. in $N_2$. The transmission spectra stayed the same with increasing $H_2$ concentrations from 200 to 2000 ppm at 110° C. (FIG. 38). In the presence of 2000 ppm $H_2$ (FIG. 39), the evolution of transmission spectrum with elevated temperatures was consistent with the previous result in the presence of $N_2$. The results indicated that $Au/SiO_2$ was not sensitive to the low concentrations of $H_2$ investigated here.

It should be appreciated that conventional optical fiber based temperature sensors and most commercial sensors for transformer monitoring cost thousands of US dollars. In this section we demonstrate how the cost of the current prototype using low-cost components can be reduced significantly. As shown in FIG. 3, the input of the low-cost prototype device employed unmounted LEDs 240 (Thorlabs, Inc.) as fixed-wavelength light sources which were powered with a lithium battery or a DC power supply in a constant current mode (not shown). Two LEDs 240 centered at 525 nm (LED525E, Thorlabs) and 591 nm (LED591E, Thorlabs) were employed to detect temperature and $H_2$ sensing responses, respectively. The output of the device applied an external reverse bias to a junction photodiode 244 (FD11A, Thorlabs, Inc.), which generated a photocurrent when light was absorbed in the depleted region of the junction semiconductor. The wavelength range of the Si photodiode 244 is 320-1100 nm covering the required optical spectrum. The current measured through the circuit indicates illumination of the device and the measured output current is linearly proportional to the input optical power. A load resistance was used to convert the generated photocurrent into a voltage for viewing on a digital multimeter 246 (34972a LXI data acquisition/data logger switch unit, Keysight) and the entire setup could be Li-battery or solar cell operated, for example, and miniaturized for field deployment.

Figure 40:
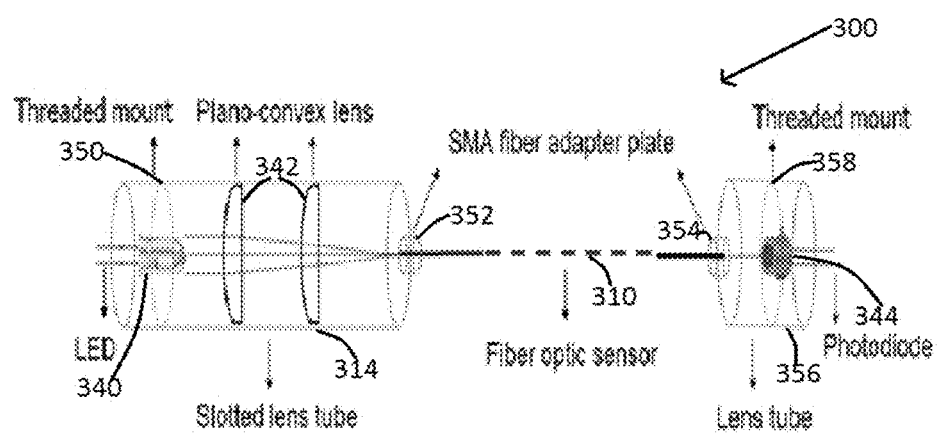
FIG. 40 depicts a schematic diagram of a detailed design of the optical assemblies.

The small diameter of the fiber 10 of FIG. 1 requires an efficient in-coupling of LED light. The low power output characteristic from LED to optical fiber requires optimization of the optical system design in order to achieve adequate signal to noise ratios. Embodiments of the compact optical assemblies, generally designed 300, house several optical elements, as illustrated in FIG. 40.

In the input optical assemblies 300, an epoxy-encased LED 340 is held by a threaded mount 350 (S05LEDM for example) and inserted into a slotted lens tube 314 (SM05L20C for example) having a 2" thread depth. Two $MgF_2$ coated (400-700 nm) plano-convex lens 342 were separated and secured by retaining rings that were positioned at the desired depth within the lens tube 314 according to an effective focal length of 12.7 mm. The slotted lens tubes 314 provided a fast and easy means for building complex optical assemblies and adjusting the optics without disassembling the setup. Optics could be manually adjusted via side slots and locked into position using the retaining rings to achieve the optimum intensity.

In the illustrated output optical assemblies 300, a photodiode 344 is secured in the mount (S05LEDM for example) and then housed inside another lens tube 356 (SM05M10 for example) having a threaded mount 358. A BFT1 Bare Fiber Terminator (not shown) and compatible connector which holds the end of the fiber 310 is connected by fiber adapter plates 352 and 354 (SM05SMA for example) and then integrated with either or both lens tubes 314, 356.

Figure 41:
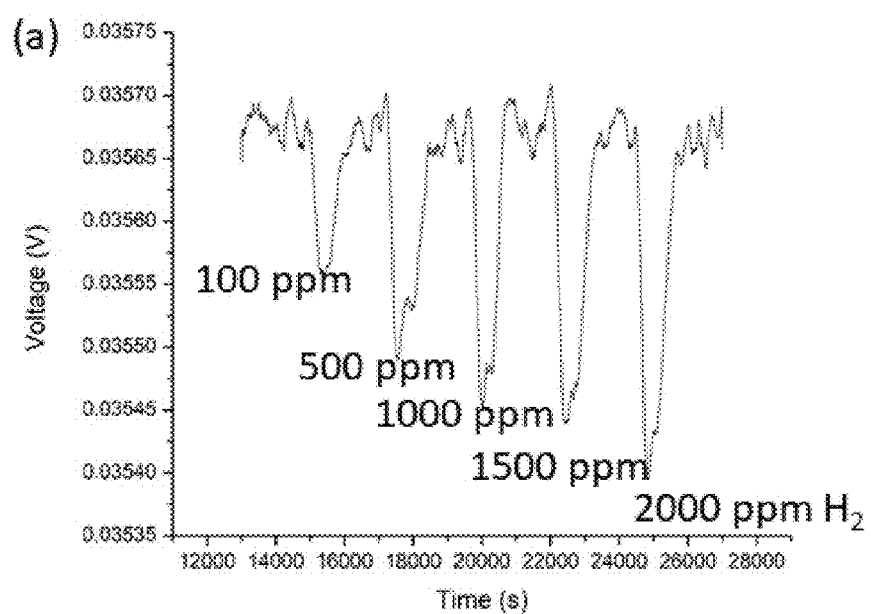
FIG. 41 illustrates of output voltage with respect to H2 concentrations.
Figure 42:
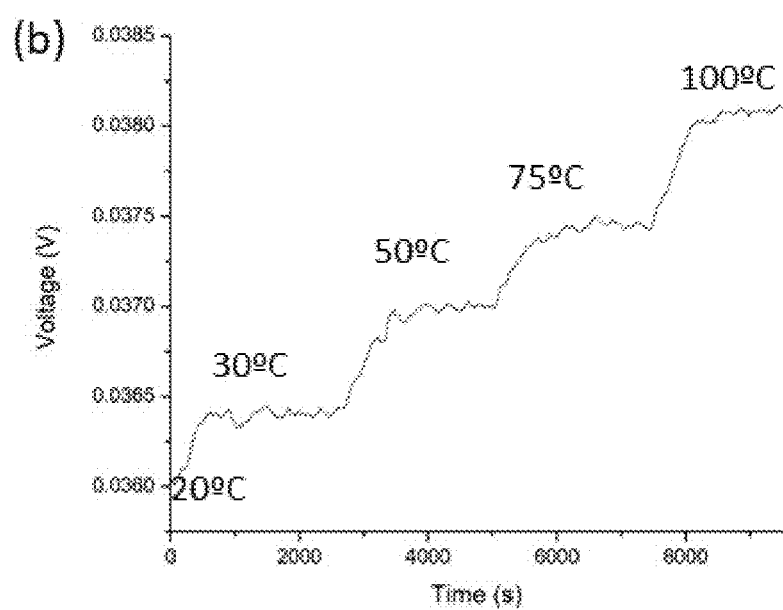
FIG. 42 illustrates variation of output voltage with respect to temperature changes.

FIGS. 41-42 illustrate the evolution of output voltage with increasing temperatures and $H_2$ concentrations. A good resolution of 0.5 mV/10° C. was obtained for temperature sensing and as low as 100 ppm $H_2$ could be detected. The transient responses demonstrate that the present prototype device could maintain the good sensitivity which was comparable to the conventional setup.

Acetylene ($C_2H_2$) may be generated from three different fault conditions: high-temperature overheating, partial discharge (low-energy), or high intensity arcing. In the case of overheating above 700° C., $C_2H_2$ represents a small proportion of the hydrocarbon gases. In the case of partial discharge, trace quantities of $C_2H_2$ will be generated relative to hydrogen ($H_2$) and methane ($CH_4$). As the intensity of the discharge escalates, the $C_2H_2$ concentration rises rapidly. When the intensity of the electrical discharge reaches arcing or continuing discharge produces temperatures above 700° C., the quantity of $C_2H_2$ becomes considerable. Depending on different fault conditions, the concentrations of $C_2H_2$ vary from 1 ppm to tens of ppm level. Therefore, analyzing the concentration and generation rate of $C_2H_2$ in transformer oil plays a significant role in the diagnosis of high-temperature related faults. However, the high operating temperature is still a great challenge in all of these cases for detecting $C_2H_2$ in the transformer oil. At lower temperatures, $C_2H_2$ does not have sufficient energy to overcome the barrier which prevents $C_2H_2$ reacting with the adsorbed oxygen ions. Recent efforts have been made to develop low-temperature $C_2H_2$ sensors.

It has been reported that a sorbent prepared by dispersing a monolayer of various metal cations ($M^{2+}$) on various high surface area substrates showed reversible and highly selective adsorption for $C_2H_2$ over other hydrocarbons by forming a weak Tr-complexation bond between $M^{2+}$ and $C_2H_2$. $NiCl_2 \cdot 6H_2O$ was chosen because it was known to spread in monolayer on $SiO_2$. The threshold dispersion capacity may be estimated by assuming the monolayer to be close-packed based on the surface area of the support so that no residual amount of salt remains in the crystalline form.

In one embodiment, a sensing layer was prepared by heating the mixture of a calculated amount of $NiCl_2 \cdot 6H_2O$, tetraethoxysiliane (TEOS), ethanol, water, and HCl for 3 days at 70° C. The solution was dip-coated onto the coreless fiber and the sensor was aged in $N_2$ for 3 days at 70° C.

Figure 43:
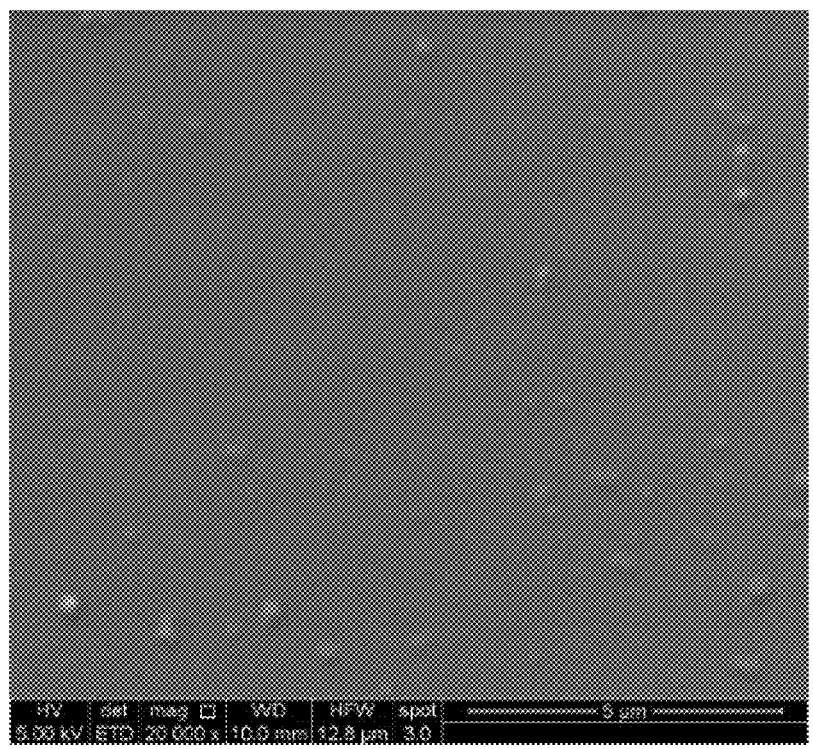
FIG. 43 depicts an SEM image for the surface morphology of an $Ni^{2+}/SiO_2$ film before $C_2H_2$ exposure.
Figure 44:
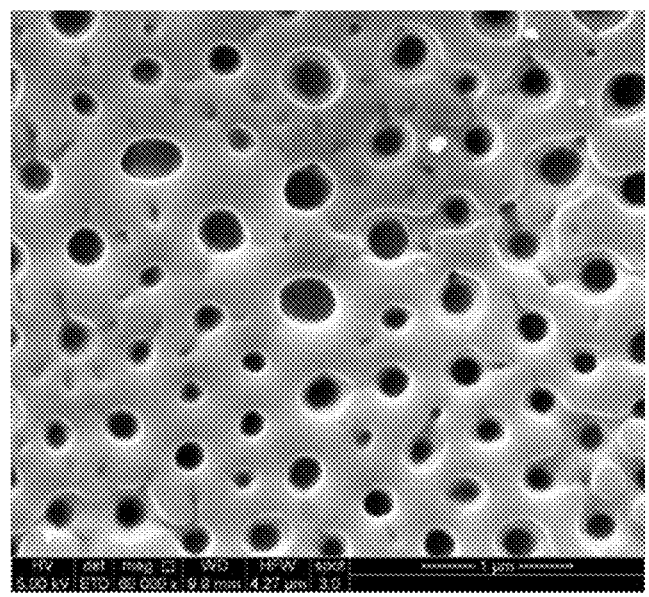
FIG. 44 depicts an SEM image for the surface morphology of an $Ni^{2+}/SiO_2$ film after $C_2H_2$ exposure.

FIG. 43 depicts an SEM image for the surface morphology of an $Ni^{2+}/SiO_2$ film before $C_2H_2$ exposure while FIG. 44 depicts an SEM image for the surface morphology of an $Ni^{2+}/SiO_2$ film after $C_2H_2$ exposure. FIG. 43 illustrates the sensor surface evolution which generated a porous network upon exposure to $C_2H_2$ at room temperature. A similar phenomenon was observed during the exposure of $NH_3$ and a Ligand exchange mechanism was proposed between the gas and water molecules, which are complexated with the salt within the $SiO_2$ network.

Figure 45:
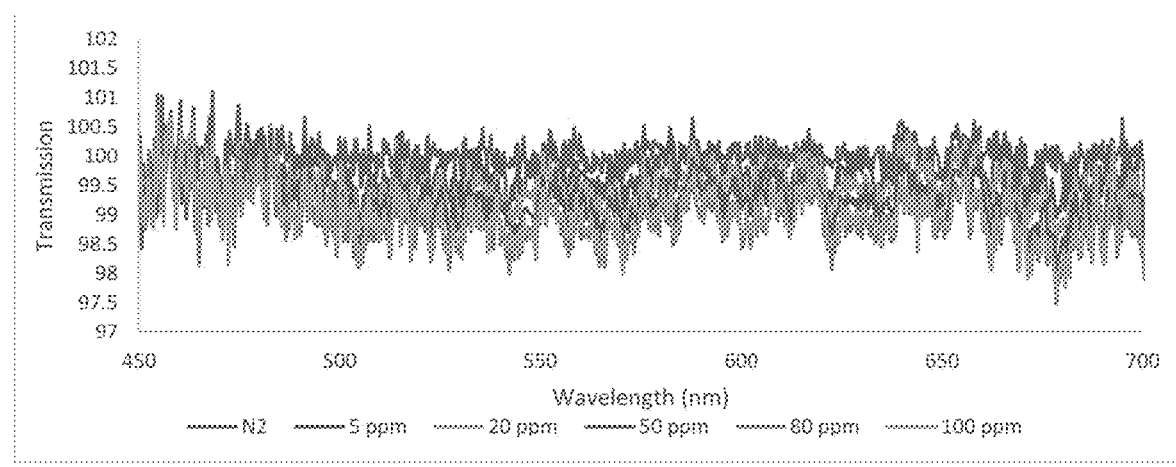
FIG. 45 illustrates Transmission spectrum of various $C_2H_2$ concentrations.
Figure 46:
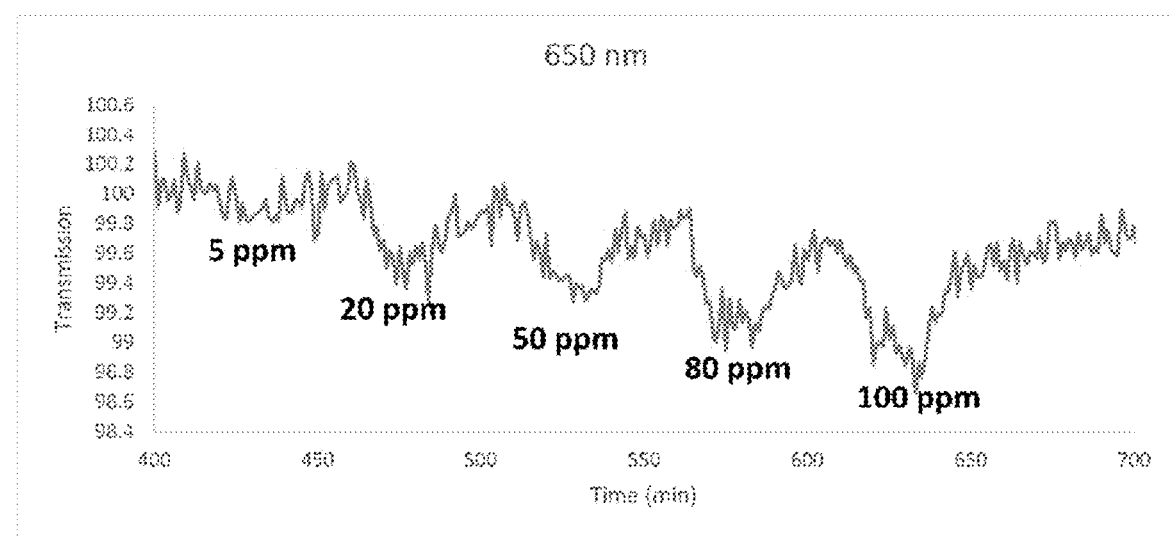
FIG. 46 illustrates the dynamic response to different concentrations of $C_2H_2$ at 650 nm.
Figure 47:
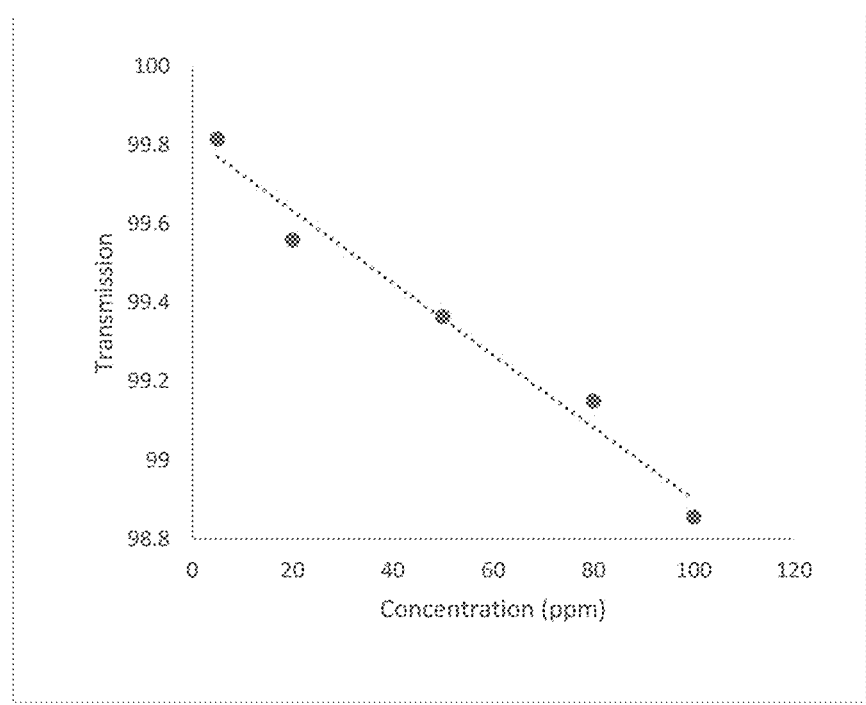
FIG. 47 illustrates the calibration curve of the sensor response.
Figure 48:
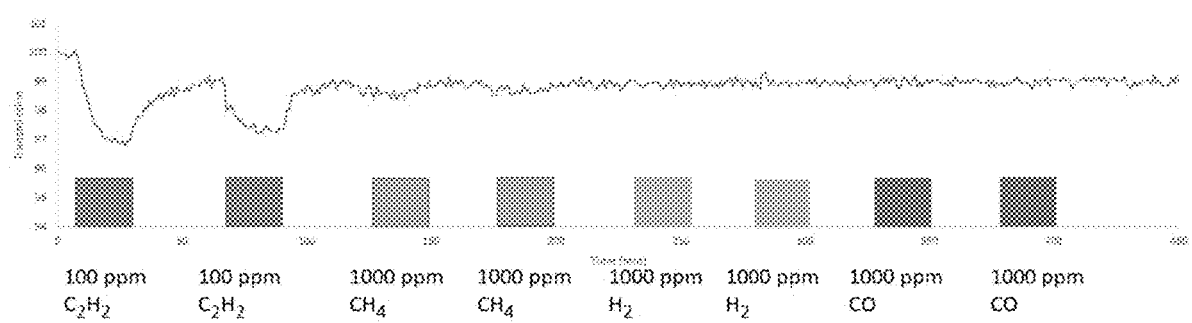
FIG. 48 illustrates cross sensitivities to various gases at room temperature.

The optical transmission spectra was recorded in the presence of different concentrations of $C_2H_2$, showing a broad band from 500-700 nm (FIG. 45). A decrease in the transmission intensity with increasing concentrations was clearly resolved and the transmission measured at 650 nm was plotted as a function of time (FIG. 46). Monotonic responses were observed with ~10 min response time and ~10 min recovery time from 5-100 ppm. A linear relation was established between the transmission intensity and $C_2H_2$ concentration as shown in FIG. 47. The sensor demonstrated excellent selectivity against 1000 ppm $H_2$ and 1000 ppm CO, while 1000 ppm $CH_4$ showed minor interference (FIG. 48).

Figure 49:
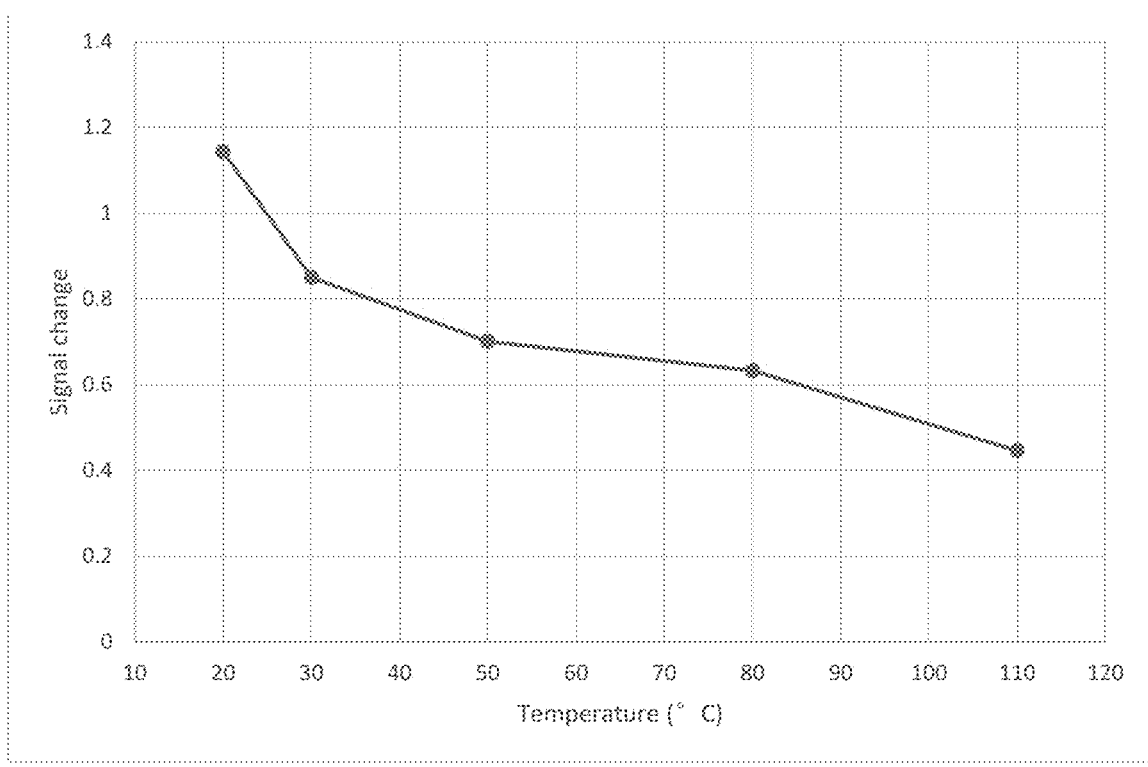
FIG. 49 illustrates the change of sensor transmission signal towards 100 ppm $C_2H_2$ at different temperatures.

Previous studies has reported that the weakly chemisorbed $C_2H_2$ on the surface $Ni^{2+}$ ions can be represented by $Ni^{2+}(C_2H_2)_n$ with n in the range of 1-3. As temperature increased, the average value of n decreased from 2.4 at 25° C. to 1.6 at 45° C., 1.2 at 60° C., and 1.1 at 70° C. The temperature dependence of $C_2H_2$ was monitored by recording the transmission intensity of 100 ppm $C_2H_2$ at various temperatures from 20 to 110° C. and relative signal change to the $N_2$ baseline was plotted in FIG. 49. The trend matched well with the previous report and indicated a decreased signal with increasing temperatures, which could be ascribed to the accelerated desorption rate of $C_2H_2$ molecules at high temperatures.

All publications and patent documents cited in this application are incorporated by reference in their entirety for all purposes to the same extent as if each individual publication or patent document were so individually denoted.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

Having described the basic concept of the embodiments, it will be apparent to those skilled in the art that the foregoing detailed disclosure is intended to be presented by way of example. Accordingly, these terms should be interpreted as indicating that insubstantial or inconsequential modifications or alterations and various improvements of the subject matter described and claimed are considered to be within the scope of the spirited embodiments as recited in the appended claims. Additionally, the recited order of the elements or sequences, or the use of numbers, letters or other designations therefor, is not intended to limit the claimed processes to any order except as may be specified. All ranges disclosed herein also encompass any and all possible sub-ranges and combinations of sub-ranges thereof. Any listed range is easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as up to, at least, greater than, less than, and the like refer to ranges which are subsequently broken down into sub-ranges as discussed above.

As utilized herein, the terms "about," "substantially," and other similar terms are intended to have a broad meaning in conjunction with the common and accepted usage by those having ordinary skill in the art to which the subject matter of this disclosure pertains. As utilized herein, the term "approximately equal to" shall carry the meaning of being within 15, 10, 5, 4, 3, 2, or 1 percent of the subject measurement, item, unit, or concentration, with preference given to the percent variance. It should be understood by those of skill in the art who review this disclosure that these terms are intended to allow a description of certain features described and claimed without restricting the scope of these features to the exact numerical ranges provided. Accordingly, the embodiments are limited only by the following claims and equivalents thereto. All publications and patent documents cited in this application are incorporated by reference in their entirety for all purposes to the same extent as if each individual publication or patent document were so individually denoted.

What is claimed is:

1. An optical sensor array, the sensor array comprising:
   an optical fiber;
   one or more multimode fibers in optical communication with the optical fiber;
   a first nanocomposite thin film along at least a portion of the optical fiber for interrogating a first parameter having a first wavelength; and
   a second nanocomposite thin film along at least a portion of the optical fiber for interrogating a second parameter having a second wavelength different from the first wavelength of the first parameter, wherein at least one of the first and second parameters is temperature.

2. The sensor array of claim 1 further comprising one or more nanocomposite thin films along at least a portion of the optical fiber for interrogating one or more parameters, each parameter uniquely correlated to signals at different wavelengths.

3. The sensor array of claim 1 wherein the first nanocomposite thin film is selected from the group comprising $Au/SiO_2$, $Pd/SiO_2$ and Ni doped porous $SiO_2$ thin film.

4. The sensor array of claim 1 wherein the second nanocomposite thin film is selected from the group comprising $Au/SiO_2$, $Pd/SiO_2$ and Ni doped porous $SiO_2$ thin film.

5. The sensor array of claim 1 wherein at least one of the first and second parameters is a chemical composition of a chemical indicator.

6. The sensor array of claim 5 wherein the chemical indicator is selected from the group comprising H2, CO, $CH_4$, $C_2H_2$, and $H_2O$.

7. The sensor array of claim 1 further comprising a filter layer of zeolite nanoblock coating over at least one of the first nanocomposite thin film and the second nanocomposite thin film.

8. An optical system for monitoring multiple parameters of an electrical asset, the optical system comprising:
- an optics system comprising one or more light emitting diodes;
- a sensor array in optical communication with the optics system, the sensor array comprising:
- an optical fiber;
- a first nanocomposite thin film along at least a portion of the optical fiber for interrogating a first parameter correlated to a signal at a first wavelength; and
- a second nanocomposite thin film along at least a portion of the optical fiber for interrogating a second parameter correlated to a signal at a second wavelength different from the first wavelength of the first parameter;
- further comprises a multimeter in communication with the one or more photodiodes and an analysis portion in optical communication with the sensor array, the analysis portion comprising one or more photodiodes, a multimeter in communication with the one or more photodiodes and a computer in communication with the multimeter, the computer performing multi-variate data analytics to extract independent information from the sensor array for optimized wavelength selection of discrete wavelengths.

9. The optical system of claim 8 wherein the optics system comprises one or more filters.

10. The optical system of claim 9 wherein the one or more filters comprises one or more lenses.

11. The optical system of claim 8 further comprising a plurality of sensor arrays connected in series.

12. The optical system of claim 8 further wherein the multi-variate data analytics comprises principal component analysis.

13. A method of monitoring multiple parameters of an electrical asset, the method comprising:
- determining a first wavelength with a signal correlated to a first parameter of the electrical asset to be monitored;
- determining a second wavelength with a signal correlated to a second parameter of the electrical asset to be monitored;
- sensing the first and second parameters using an optical fiber, one or more multimode fibers in optical communication with the optical fiber; the optical fiber having a first nanocomposite thin film along at least a portion of the optical fiber for interrogating the first parameter through a first correlated signal having the first wavelength and a second nanocomposite thin film along at least a portion of the optical fiber for interrogating the second parameter through a second correlated signal, wherein at least one of the first and second parameters is temperature.

* * * * *